US012796560B2

(12) United States Patent
Che

(10) Patent No.: US 12,796,560 B2
(45) Date of Patent: Nov. 10, 2026

(54) TERRACED SUPPORT STRUCTURE TO MITIGATE STACKED DIE OVERHANG DEFLECTION

(71) Applicant: Micron Technology, Inc., Boise, ID (US)

(72) Inventor: Faxing Che, Singapore (SG)

(73) Assignee: Micron Technology, Inc., Boise, ID (US)

( * ) Notice: Subject to any disclaimer, the term of this patent is extended or adjusted under 35 U.S.C. 154(b) by 310 days.

(21) Appl. No.: 18/433,911

(22) Filed: Feb. 6, 2024

(65) Prior Publication Data

US 2024/0274580 A1 Aug. 15, 2024

Related U.S. Application Data

(60) Provisional application No. 63/484,886, filed on Feb. 14, 2023.

(51) Int. Cl.

| | |
|---|---|
| ***H10W 90/24*** | (2026.01) |
| ***H10B 80/00*** | (2023.01) |
| ***H10W 40/70*** | (2026.01) |
| ***H10W 90/00*** | (2026.01) |
| ***H10W 99/00*** | (2026.01) |
| *H10W 90/20* | (2026.01) |

(52) U.S. Cl.

CPC ............ *H10W 90/00* (2026.01); *H10B 80/00* (2023.02); *H10W 40/70* (2026.01); *H10W 99/00* (2026.01); *H10W 90/231* (2026.01); *H10W 90/24* (2026.01); *H10W 90/734* (2026.01)

(58) Field of Classification Search

CPC ... H10W 40/22; H10W 40/70; H10W 42/121; H10W 72/073; H10W 72/30; H10W 76/403; H10W 90/00; H10W 90/231; H10W 90/24; H10W 90/288; H10W 90/297; H10W 90/722; H10W 90/724; H10W 90/734; H10W 90/754; H10W 95/00; H10W 99/00; H10B 80/00

See application file for complete search history.

(56) References Cited

U.S. PATENT DOCUMENTS

| | | | |
|---|---|---|---|
| 12,660,692 B2 * | 6/2026 | Sun | H10W 90/00 |
| 2023/0011439 A1 * | 1/2023 | Zhang | G11C 11/06 |

* cited by examiner

*Primary Examiner* — Hoai V Pham

(74) *Attorney, Agent, or Firm* — Harrity & Harrity, LLP

(57) ABSTRACT

Implementations described herein relate to various semiconductor device assemblies. In some implementations, a semiconductor device assembly includes a substrate. The semiconductor device assembly includes a first semiconductor die above the substrate including an edge and a second semiconductor die in a stacked arrangement above the first semiconductor die. The second semiconductor die comprises an overhang portion extending beyond the edge. The semiconductor device assembly includes a terraced support structure between the overhang portion and the substrate. The terraced support structure may mitigate deflection of the overhang portion during a molding operation to prevent damage to the semiconductor device assembly.

20 Claims, 18 Drawing Sheets

TERRACED SUPPORT STRUCTURE TO MITIGATE STACKED DIE OVERHANG DEFLECTION

CROSS-REFERENCE TO RELATED APPLICATION

This Patent Application claims priority to U.S. Provisional Patent Application No. 63/484,886, filed on Feb. 14, 2023, entitled "TERRACED SUPPORT STRUCTURE TO MITIGATE STACKED DIE OVERHANG DEFLECTION," and assigned to the assignee hereof. The disclosure of the prior Application is considered part of and is incorporated by reference into this Patent Application.

TECHNICAL FIELD

The present disclosure generally relates to semiconductor devices and methods of forming semiconductor devices. For example, the present disclosure relates to a terraced support structure to mitigate stacked die overhang deflection.

BACKGROUND

A semiconductor package may include a semiconductor substrate, one or more semiconductor electronic components coupled to and/or embedded in the semiconductor substrate, and a casing formed over the semiconductor substrate to encapsulate the one or more semiconductor electronic components. The one or more semiconductor electronic components may be interconnected by electrical interconnects to form one or more semiconductor devices, such as one or more integrated circuits (ICs) (e.g., one or more dies or chips). For example, the semiconductor electronic components and the electrical interconnects may be fabricated on a semiconductor wafer to form one or more ICs before being diced into dies or chips and then packaged. A semiconductor package may be referred to as a semiconductor chip package that includes one or more ICs. A semiconductor package protects the semiconductor electronic components and the electrical interconnects from damage and includes a mechanism for connecting the semiconductor electronic components and the electrical interconnects to external components (e.g., a circuit substrate), such as via balls, pins, leads, contact pads, or other electrical interconnect structures. A semiconductor device assembly may be or may include a semiconductor package, multiple semiconductor packages, and/or one or more components of a semiconductor package (e.g., one or more semiconductor devices with or without a casing).

An electronic system assembly may include multiple semiconductor packages electrically coupled to a carrier substrate (e.g., circuit substrate). An electronic system assembly may include additional system components electrically coupled to the carrier substrate. The carrier substrate may include electrical interconnects and conductive paths used for interconnecting system components, including the multiple semiconductor packages and other system components of the electronic system assembly. Accordingly, the multiple semiconductor packages may be electrically connected to each other and/or to one or more additional system components via the carrier substrate to form the electronic system assembly. By way of example, other system components may include passive components (e.g., storage capacitors), processing units (e.g., a central processing unit (CPU), a graphics processing unit (GPU), a microprocessor, and/or a microcontroller), control units (e.g., a microcontroller, a memory controller, and/or a power management controller), or one or more other electronic components.

DETAILED DESCRIPTION

A semiconductor die package may include multiple semiconductor dies in a stacked arrangement to reduce a footprint of the dies. Within the stacked arrangement, one or more of the multiple semiconductor dies may include overhang portions that extend beyond edges of underlying semiconductor dies. During a molding operation that encapsulates the multiple semiconductor dies, pressure and/or forces may cause deflections to ends of one or more of the overhang portions. These deflections may cause quality and reliability issues within the semiconductor die package. Such quality and reliability issues may include die cracking, or cosmetic defects, among other examples.

As a result of the quality and reliability issues, a manufacturing yield of the semiconductor die packages may be decreased. Additionally, or alternatively and due to the quality and reliability issues, a field failure rate of the semiconductor die packages may be increased. To overcome the reduction in the manufacturing yield and/or the increase in the field failure rate, an increase in resources (e.g., semiconductor manufacturing tools, manpower, computing resources, and/or raw materials) may be required to support a market that consumes a volume of the semiconductor die packages.

Some implementations described herein are directed to a semiconductor die package including a stacked die arrangement. The semiconductor die package includes a terraced support structure between respective overhang portions of the stacked die arrangement and a substrate of the semiconductor die package. The terraced support structure may reduce a likelihood of the respective overhang portions deflecting during manufacturing of the semiconductor die package. By reducing the likelihood of the overhang portions deflecting, a quality and reliability of the semiconductor die package may be increased relative to a quality and reliability of another semiconductor die package (e.g., including another stacked die arrangement) that does not include the terraced support structure.

In this way, an amount of resources (e.g., semiconductor manufacturing tools, manpower, computing resources, and/ or raw materials) needed to support a market of the semiconductor die package may be decreased. Such resources may, accordingly, be reallocated to other semiconductor die package manufacturing needs.

Figure 1:
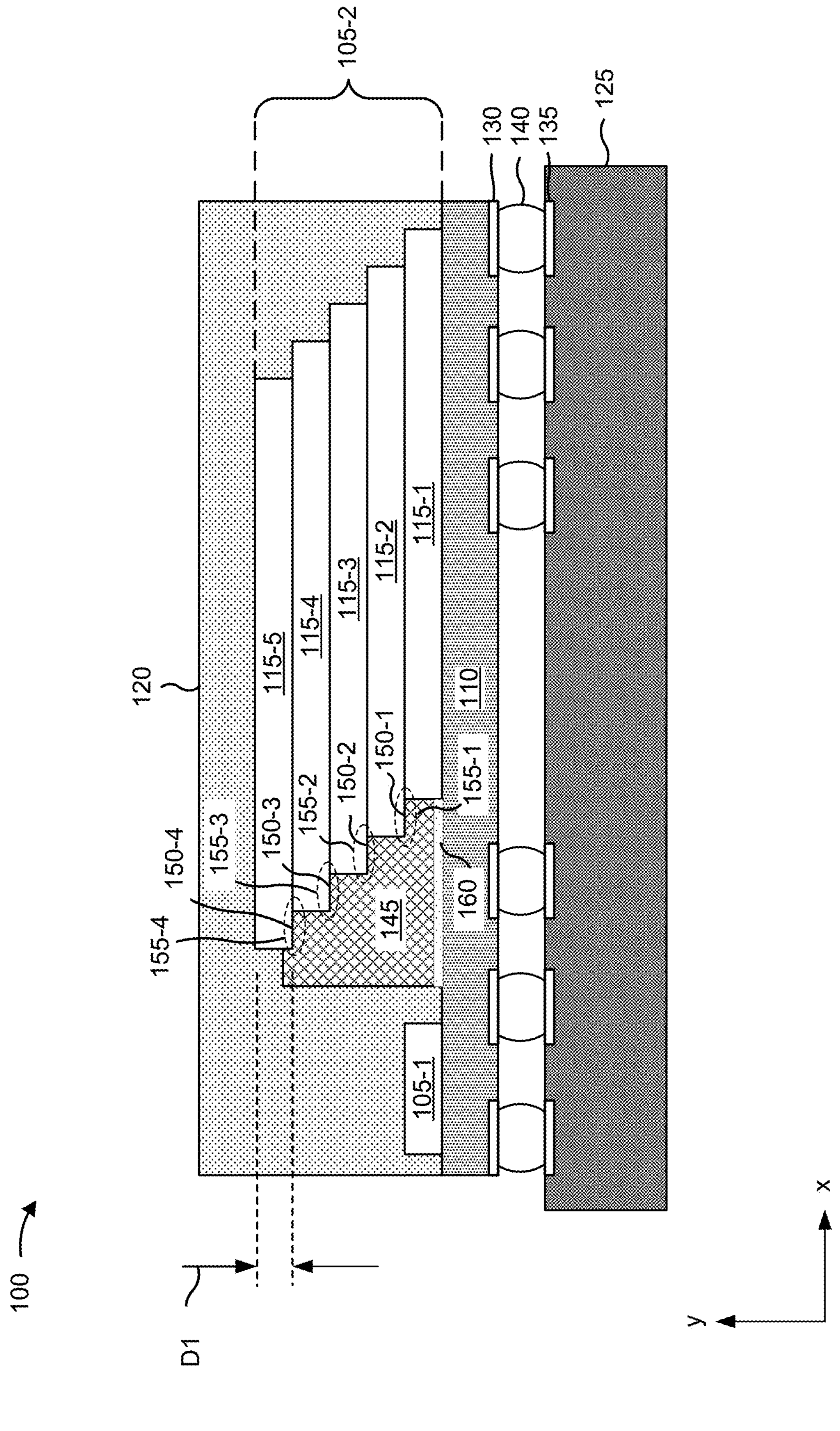
FIG. 1 is a diagram of an example apparatus that may be manufactured using techniques described herein.

FIG. 1 is a diagram of an example apparatus 100 that may be manufactured using techniques described herein. The apparatus 100 may include any type of device or system that includes one or more integrated circuits 105. For example, the apparatus 100 may include a memory device, a flash memory device, a NAND memory device, a NOR memory device, a random access memory (RAM) device, a read-only memory (ROM) device, a dynamic RAM (DRAM) device, a static RAM (SRAM) device, a solid state drive (SSD), a microchip, and/or a system on a chip (SoC), among other examples. In some cases, the apparatus 100 may be referred to as a semiconductor die package, an assembly, a semiconductor device assembly, or an integrated assembly.

As shown in FIG. 1 (e.g., a side view of the apparatus 100), the apparatus 100 may include one or more integrated circuits 105, shown as a first integrated circuit 105-1 and a second integrated circuit 105-2, disposed on a substrate 110. An integrated circuit 105 may include any type of circuit, such as an analog circuit, a microcontroller, a digital circuit, a radiofrequency (RF) circuit, a power supply, a power management circuit, an input-output (I/O) chip, an application-specific integrated circuit (ASIC), a field-programmable gate array (FPGA), and/or a memory device (e.g., a NAND memory device, a NOR memory device, a RAM device, or a ROM device). An integrated circuit 105 may be mounted on or otherwise disposed on a surface of the substrate 110. Although the apparatus 100 is shown as including two integrated circuits 105 as an example, the apparatus 100 may include a different number of integrated circuits 105.

In some implementations, an integrated circuit 105 may include a single semiconductor die 115 (sometimes called a die), as shown by the first integrated circuit 105-1. In some implementations, an integrated circuit 105 may include multiple semiconductor dies 115 (sometimes called dies), as shown by the second integrated circuit 105-2, which is shown as including five semiconductor dies 115-1 through 115-5.

As shown in FIG. 1, for an integrated circuit 105 that includes multiple dies 115, the dies 115 may be stacked on top of each other to reduce a footprint of the apparatus 100. In some implementations, a spacer may be present between dies 115 that are proximate to one another in the stack to enable electrical separation and heat dissipation. The stacked dies 115 may include three-dimensional electrical interconnects, such as through-silicon vias (TSVs), to route electrical signals between dies 115. Although the integrated circuit 105-2 is shown as including five dies 115, an integrated circuit 105 may include a different number of dies 115 (e.g., at least two dies 115). A first die 115-1 (sometimes called a bottom die or a base die) may be disposed on the substrate 110, a second die 115-2 may be disposed on the first die 115-1, and so on. Although FIG. 1 shows the dies 115 stacked in a shingle stack (e.g., with die edges that are not aligned, which provides space for wire bonding near the edges of the dies 115), in some implementations, the dies 115 may be stacked in a different arrangement, such as a straight stack (e.g., with aligned die edges).

In some implementations, a thickness D1 of each of the dies 115 may be included in a range of approximately 40 microns to approximately 50 microns. If the thickness D1 is less than approximately 40 microns, a robustness of the dies 115 may be insufficient to withstand manufacturing operations (e.g., assembly operations) used to form the apparatus 100. If the thickness D1 is greater than approximately 50 microns, an overall thickness of the apparatus 100 may not satisfy a thickness threshold necessary for an end use (e.g., a field use) of the apparatus 100. However, ranges for the thickness D1 are within the scope of the present disclosure.

The apparatus 100 may include a casing 120 that protects internal components of the apparatus 100 (e.g., the integrated circuits 105) from damage and environmental elements (e.g., particles) that can lead to malfunction of the apparatus 100. The casing 120 may be a mold compound, a plastic (e.g., an epoxy plastic), a ceramic, or another type of material depending on the functional requirements for the apparatus 100.

In some implementations, the apparatus 100 may be included as part of a higher-level system (e.g., a computer, a mobile phone, a network device, an SSD, a vehicle, or an Internet of Things device), such as by electrically connecting the apparatus 100 to a circuit board 125, such as a printed circuit board. For example, the substrate 110 may be disposed on the circuit board 125 such that electrical contacts 130 (e.g., bond pads) of the substrate 110 are electrically connected to electrical contacts 135 (e.g., bond pads) of the circuit board 125.

In some implementations, the substrate 110 may be mounted on the circuit board 125 using solder balls 140 (e.g., arranged in a ball grid array), which may be melted to form a physical and electrical connection between the substrate 110 and the circuit board 125. Additionally, or alternatively, the substrate 110 may be mounted on and/or electrically connected to the circuit board 125 using another type of connector, such as pins or leads. Similarly, an integrated circuit 105 may include electrical pads (e.g., bond pads) that are electrically connected to corresponding electrical pads (e.g., bond pads) of the substrate 110 using electrical bonding, such as wire bonding, bump bonding, or the like. The interconnections between an integrated circuit 105, the substrate 110, and the circuit board 125 enable the integrated circuit 105 to receive and transmit signals to other components of the apparatus 100 and/or the higher-level system.

FIG. 1 further shows an example terraced support structure 145. The terraced support structure 145 may correspond to a solid body that includes a silicon material, a ceramic material, a glass material, or a polymer material, among other examples.

The terraced support structure 145 includes terraces 150-1 through 150-4. The terraces 150-1 through 150-4 are between overhang portions 155-1 through 155-4 and the substrate 110. In some implementations, at least one of the terraces 150-1 through 150-4 is in contact with a corresponding overhang portion. In some implementations, at least one of the terraces 150-1 through 150-4 is separated from a corresponding overhang portion. Further, a compliant material (e.g., an underfill material or an epoxy polymer material) may be between at least one of the terraces 150-1 through 150-4 and a corresponding overhang portion.

In some implementations, and as shown in FIG. 1, an adhesive layer 160 (e.g., a die attach film, an epoxy film) connects the terraced support structure 145 and the substrate 110. As described in greater detail in connection with FIGS. 2-9, and elsewhere herein, the apparatus 100 may include multiple implementations of the terraced support structure 145 to mitigate stacked die overhang deflection.

As described in connection with FIG. 1 and elsewhere herein, a semiconductor device assembly (e.g., the apparatus 100) includes a substrate (e.g., the substrate 110). The semiconductor device assembly includes a first semiconductor die (e.g., the semiconductor die 115-4) that is above the substrate and that includes an edge. The semiconductor device assembly includes a second semiconductor die (e.g., the semiconductor die 115-5) that is in a stacked arrangement above the first semiconductor die and that includes an overhang portion (e.g., the overhang portion 155-4) extending beyond the edge. The semiconductor device assembly includes a terraced support structure (e.g., the terraced support structure 145) between the overhang portion and the substrate. The terraced support structure includes a terrace (e.g., the terrace 150-4) traversing a path that is approximately parallel to the edge and directly below the overhang portion.

As indicated above, FIG. 1 is provided as an example. Other examples may differ from what is described with regard to FIG. 1.

Figure 2:
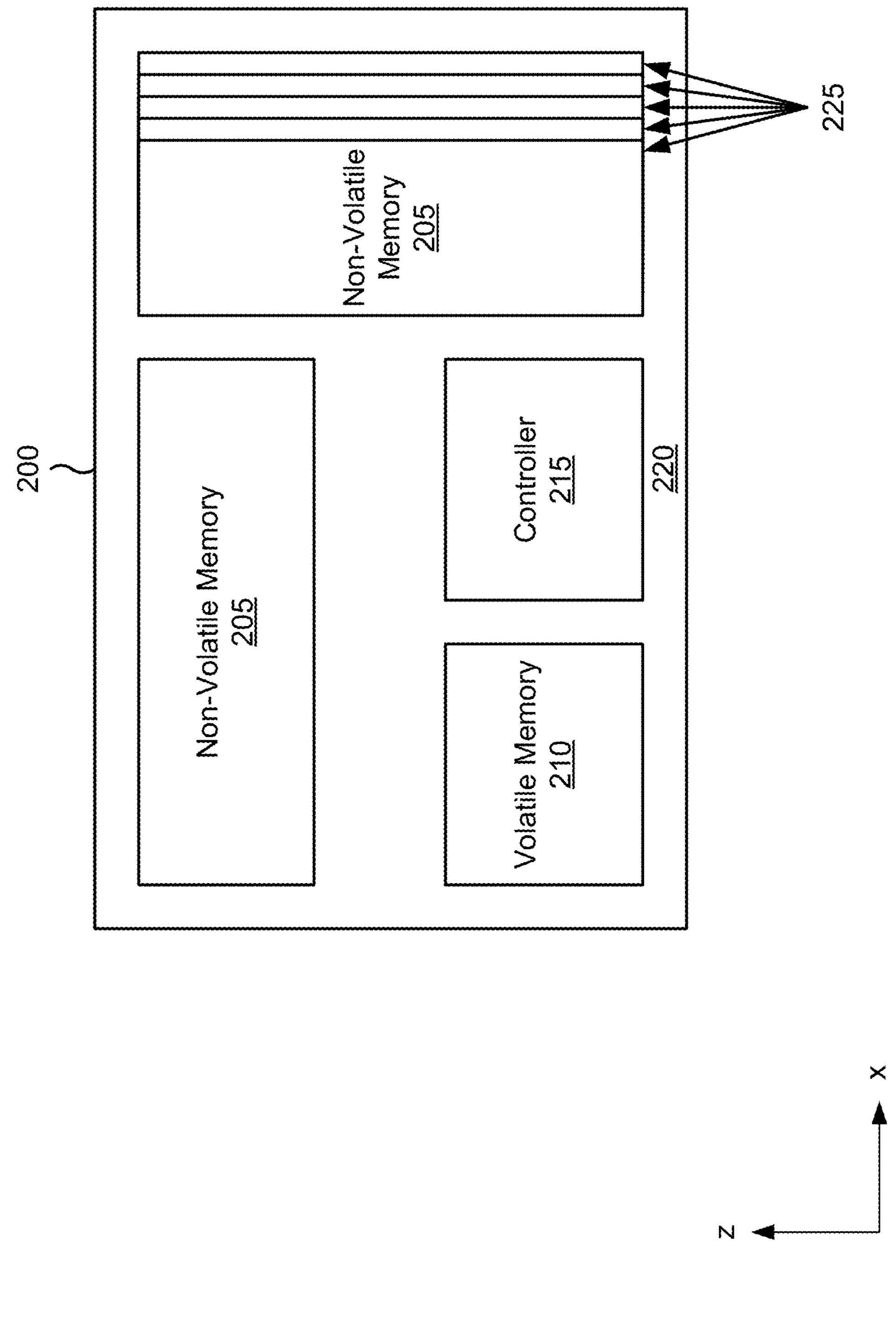
FIG. 2 is a diagram of an example memory device that may be manufactured using techniques described herein.

FIG. 2 is a diagram of an example memory device 200 that may be manufactured using techniques described herein. The memory device 200 is an example of the apparatus 100 described above in connection with FIG. 1. The memory device 200 may be any electronic device configured to store data in memory. In some implementations, the memory device 200 may be an electronic device configured to store data persistently in non-volatile memory 205. For example, the memory device 200 may be a hard drive, an SSD, a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device.

As shown in FIG. 2 (e.g., a plan view of the memory device), the memory device 200 may include non-volatile memory 205, volatile memory 210, and a controller 215. The components of the memory device 200 may be mounted on or otherwise disposed on a substrate 220. In some implementations, the non-volatile memory 205 includes a single die. Additionally, or alternatively, the non-volatile memory 205 may include multiple dies, such as stacked semiconductor dies 225 (e.g., in a straight stack, a shingle stack, or another type of stack), as described above in connection with FIG. 1.

The non-volatile memory 205 may be configured to maintain stored data after the memory device 200 is powered off. For example, the non-volatile memory 205 may include NAND memory or NOR memory. The volatile memory 210 may require power to maintain stored data and may lose stored data after the memory device 200 is powered off. For example, the volatile memory 210 may include one or more latches and/or RAM, such as DRAM and/or SRAM. As an example, the volatile memory 210 may cache data read from or to be written to non-volatile memory 205, and/or may cache instructions to be executed by the controller 215.

The controller 215 may be any device configured to communicate with the non-volatile memory 205, the volatile memory 210, and a host device (e.g., via a host interface of the memory device 200). For example, the controller 215 may include a memory controller, a system controller, an ASIC, an FPGA, a processor, a microcontroller, and/or one or more processing components. In some implementations, the memory device 200 may be included in a system that includes the host device. The host device may include one or more processors configured to execute instructions and store data in the non-volatile memory 205.

The controller 215 may be configured to control operations of the memory device 200, such as by executing one or more instructions (sometimes called commands). For example, the memory device 200 may store one or more instructions as firmware, and the controller 215 may execute those one or more instructions. Additionally, or alternatively, the controller 215 may receive one or more instructions from a host device via a host interface, and may execute those one or more instructions. For example, the controller 215 may transmit signals to and/or receive signals from the non-volatile memory 205 and/or the volatile memory 210 based on the one or more instructions, such as to transfer data to (e.g., write or program), to transfer data from (e.g., read), and/or to erase all or a portion of the non-volatile memory 205 (e.g., one or more memory cells, pages, sub-blocks, blocks, or planes of the non-volatile memory 205).

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2.

Figure 3:
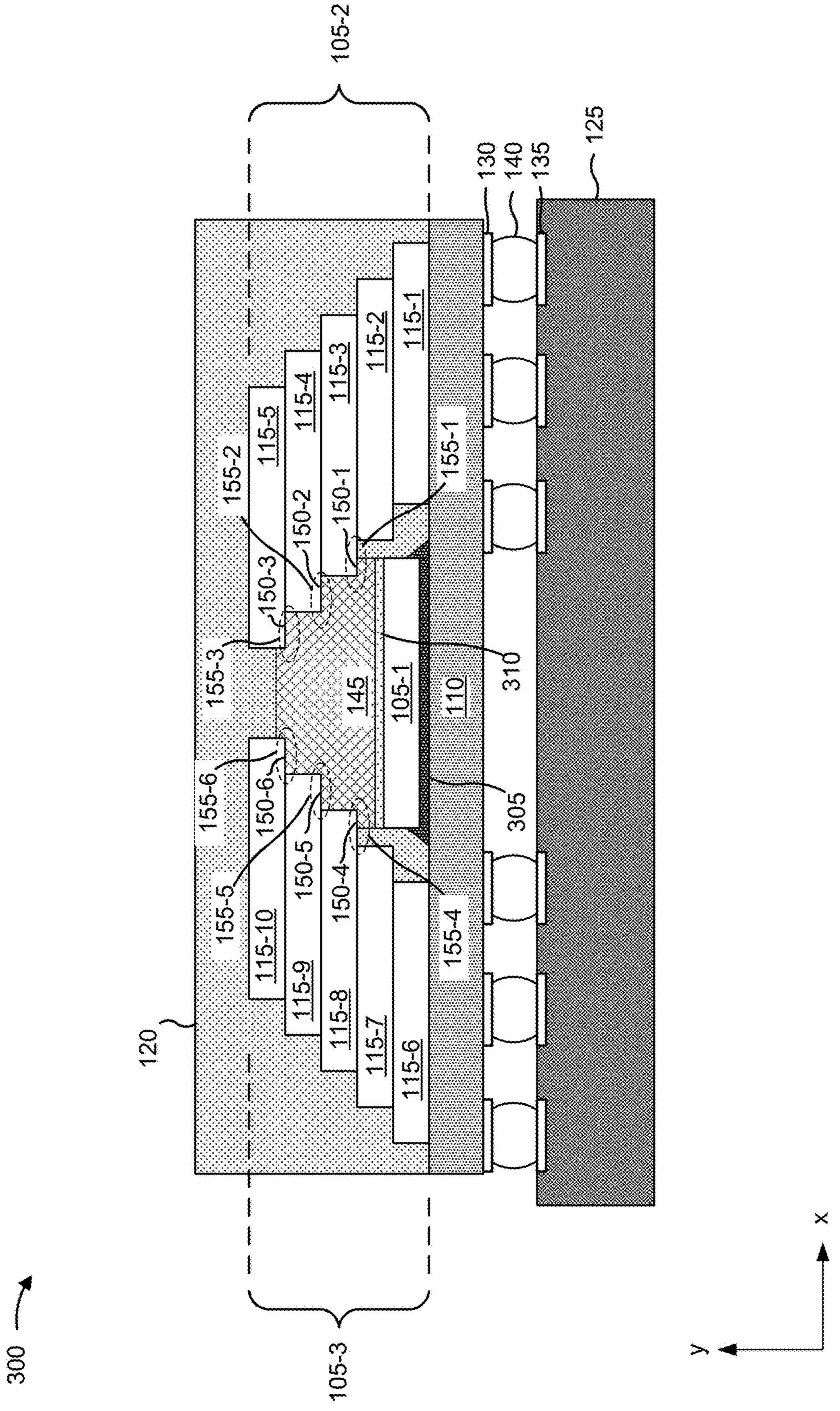
FIG. 3 is a diagram of an example apparatus that includes a terraced support structure.

FIG. 3 is a diagram of an example apparatus 300 that includes the terraced support structure 145. The apparatus 300 of FIG. 3 (e.g., a semiconductor device assembly) further includes the integrated circuit 105-2 (e.g., the semiconductor dies 115-1 through 115-5) and the integrated circuit 105-3 (e.g., the semiconductor dies 115-6 through 115-10).

As shown in FIG. 3 (e.g., a side view of the apparatus 300) and in some implementations, edges of the semiconductor dies 115-1 through 115-5 form a staggered profile and edges of the semiconductor dies 115-6 through 115-10 form another staggered profile. In some implementations, the staggered profile formed by the edges of the semiconductor dies 115-1 through 115-5 is symmetric with the staggered profile formed by the edges of the semiconductor dies 115-6 through 115-10. In some implementations, the staggered profile formed by the edges of the semiconductor dies 115-1 through 115-5 is asymmetric with the staggered profile formed edges of the semiconductor dies 115-6 through 115-10.

In FIG. 3, the semiconductor dies 115-3 through 115-5 include the overhang portions 155-1 through 155-3. Edges of the overhang portions 155-1 through 155-3 may form a staggered profile. Additionally, or alternatively and as shown in FIG. 3, the semiconductor dies 115-8 through 115-10 include the overhang portions 155-4 through 155-6. Edges of the overhang portions 155-4 through 155-6 may form another staggered profile.

FIG. 3 shows another example of the terraced support structure 145. The terraced support structure 145 may correspond to a solid body that includes a silicon material, a ceramic material, a glass material, or a polymer material, among other examples.

The terraced support structure 145 of FIG. 3 includes the terraces 150-1 through 150-3. The terraces 150-1 through 150-3 are between the substrate 110 and the overhang portions 155-1 through 155-3. In some implementations, a profile of the terraces 150-1 through 150-3 approximately matches the staggered profile of the overhang portions 155-1 through 155-3.

As shown in FIG. 3, the terraced support structure 145 further includes the terraces 150-4 through 150-6. The terraces 150-4 through 150-6 are between the substrate and the overhang portions 155-4 through 155-6. In some implementations, a profile of the terraces 150-4 through 150-6 approximately matches the staggered profile of the overhang portions 155-4 through 155-6.

In some implementations, at least one of the terraces 150-1 through 150-6 is in contact with a corresponding overhang portion. In some implementations, at least one of the terraces 150-1 through 150-6 is separated from a corresponding overhang portion. Further, a compliant material (e.g., an epoxy polymer material) may be between at least one of the terraces 150-1 through 150-6 and a corresponding overhang portion.

As shown in FIG. 3, the terraces 150-1 through 150-3 of the terraced support structure 145 support the semiconductor dies 115-3 through 115-5 (e.g., overhang portions 155-1 through 155-3). Further, and as shown in FIG. 3, the terraces 150-4 through 150-6 support semiconductor dies 115-8 through 115-10 (e.g., the overhang portions 155-4 through 155-6). In some implementations, the terraced support structure 145 supports additional semiconductor dies (e.g., additional overhang portions) of the integrated circuits 105-2 and 105-3. In some implementations, the terraced support structure 145 supports fewer semiconductor dies (e.g., fewer overhang portions) of the integrated circuits 105-2 and 105-3.

Additionally, or alternatively and in some implementations, a single terrace may support two or more semiconductor dies. For example, in a case where the overhang portion 155-3 of the semiconductor die 115-5 and the overhang portion of 155-6 of the semiconductor die 115-10 are at a same height, the terraces 150-3 and 150-6 may "merge" to form a single terrace that supports the overhang portions 155-3 and 155-6.

FIG. 3 further shows the integrated circuit 105-1 between the integrated circuits 105-2 and 105-3. The integrated circuit 105-1 (e.g., a microcontroller) may correspond to a bumped die that is joined to the substrate 110 using a surface mount (SMT) process. Additionally, or alternatively, an underfill material 305 (e.g., an epoxy polymer) may be between the integrated circuit 105-1 and the substrate 110. In some implementations, the integrated circuit 105-1 is communicatively coupled to the integrated circuits 105-2 and 105-3 through the substrate 110.

As shown in FIG. 3, the terraced support structure 145 may be on and/or over the integrated circuit 105-1. In some implementations, an adhesive layer 310 (e.g., a die attach film, an epoxy material) joins the terraced support structure 145 and the integrated circuit 105-1.

As described in connection with FIG. 3 and elsewhere herein, in some implementations a semiconductor device assembly (e.g., the apparatus 300) includes a substrate (e.g., the substrate 110). The semiconductor assembly includes a first semiconductor die (e.g., the semiconductor die 105-3), in a first stack of semiconductor dies (e.g., a stack of semiconductor dies including the semiconductor dies 115-1 through 115-5), that is above the substrate and that includes a first edge. The semiconductor device assembly includes a second semiconductor die (e.g., the semiconductor die 115-8), in a second stack of semiconductor dies (e.g., a stack of semiconductor dies including the semiconductor dies 115-6 through 115-10) above the substrate, proximate to the first semiconductor die, and including a second edge that is approximately parallel the first edge and separated from the first edge. Furthermore, the semiconductor device assembly includes a third semiconductor die (e.g., the semiconductor die 115-4) in a stacked arrangement above the first semiconductor die in the first stack of semiconductor dies and including a first overhang portion (e.g., the overhang portion 155-2) extending beyond the first edge. The semiconductor device assembly further includes a fourth semiconductor die (e.g., the semiconductor die 115-9) in a stacked arrangement above the second semiconductor die in the second stack of semiconductor dies and including a second overhang portion (e.g., the overhang portion 155-5) extending beyond the second edge. The semiconductor device assembly further includes a terraced support structure (e.g., the terraced support structure 145) between the first semiconductor die and the second semiconductor die. The terraced support structure includes a first terrace (e.g., the terrace 150-2) directly under the first overhang portion and that is configured to support the first overhang portion and a second terrace (e.g., the terrace 150-5) directly under the second overhang portion and that is configured to support the second overhang portion.

Additionally, or alternatively and as described in connection with FIG. 3 and elsewhere herein, in some implementations a semiconductor device assembly (e.g. the apparatus 300) includes a substrate (e.g., the substrate 110). The semiconductor device assembly includes a first stack of semiconductor dies (e.g., the semiconductor dies 115-1 through 115-5) above the substrate. The first stack of semiconductor dies includes first overhang portions (e.g., the overhang portions 155-1 through 155-3) having a first staggered profile. The semiconductor device assembly includes a second stack of semiconductor dies (e.g., the semiconductor dies 115-6 through 115-10) above the substrate. The second stack of semiconductor dies includes second overhang portions (e.g., the overhang portions 155-4 through 155-6) having a second staggered profile, wherein the second overhang portions extend laterally towards the first stack of semiconductor dies. The semiconductor device assembly includes a terraced support structure (e.g., the terraced support structure 145) between the first stack of semiconductor dies and the second stack of semiconductor dies. The terraced support structure includes a first set of terraces (e.g., the terraces 150-1 through 150-3) that conforms to the first staggered profile; and a second set of terraces (e.g., the terraces 150-4 through 150-6) that conforms to the second staggered profile.

As indicated above, FIG. 3 is provided as an example. Other examples may differ from what is described with regard to FIG. 3. The number and arrangement of components shown in FIG. 3 are provided as an example. In practice, there may be additional components, fewer components, different components, or differently arranged components than those shown in FIG. 3.

Figure 4:
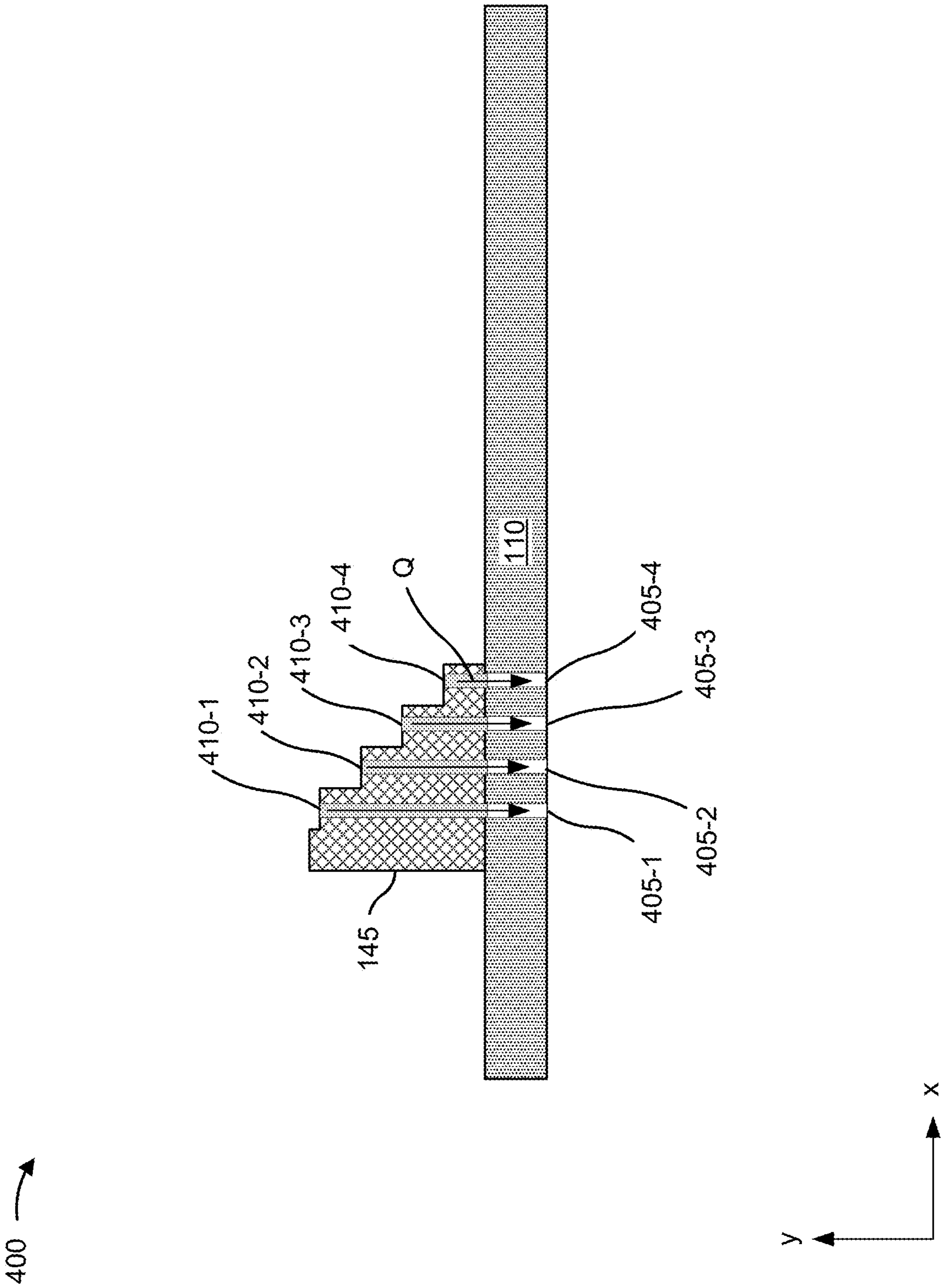
FIG. 4 is a diagram of an example implementation of the terraced support structure.

FIG. 4 is a diagram of an example implementation 400 of the terraced support structure 145. In the side view of FIG. 4 (e.g., a section view of a portion of an apparatus), the terraced support structure 145 connects with the thermal vertical interconnect access (via) structures 405-1 through 405-4 that pass through the substrate 110. In some implementations, and as shown in FIG. 4, the terraced support structure 145 is thermally coupled to the thermal via structures 405-1 through 405-4 using thermal via structures 410-1 through 410-4 that are formed within the terraced support structure 145. As shown in FIG. 4, and in some implementations, one or more of the thermal via structures 405-1 through 405-4 align with one or more of the thermal via structures 410-1 through 410-4. The connections of the thermal via structures 405-1 through 405-4 and the thermal via structures 410-1 through 410-4, sometimes referred to as thermal contacts, provide paths for heat transfer (e.g., "Q" in watts) from the terraced support structure 145 to the thermal via structures 405-1 through 405-4.

In some implementations, the thermal via structures 405-1 through 405-4 and/or the thermal via structures 410-1 through 410-4 include a material with relatively high thermal conductivity (e.g., a copper material, an aluminum material). In some implementations, the thermal via structures 405-1 through 405-4 connect to additional structures and/or features (e.g., solder balls, heat sinks) to transfer heat away from terraced support structure 145 for dissipation.

In some implementations, the terraced support structure 145 (e.g., the thermal via structures 410-1 through 410-4) may transfer heat at a rate that enables a junction temperature of one or more semiconductor dies above or adjacent to the terraced support structure 145 (e.g., the semiconductor dies 115-1 through 115-5) to satisfy a threshold. In such cases, an electrical performance of the one or more semiconductor dies (e.g., a signaling speed) may increase relative to one or more other semiconductor dies not satisfying the threshold. Additionally, or alternatively and in such a case, a useful life of one or more semiconductor dies may extend relative to the one or more other semiconductor dies.

As indicated above, FIG. 4 is provided as an example. Other examples may differ from what is described with regard to FIG. 4. The number and arrangement of components shown in FIG. 4 are provided as an example. In practice, there may be additional components, fewer components, different components, or differently arranged components than those shown in FIG. 4.

FIGS. 5A-5F describe an example series of operations 500 that may be used to form a terraced support structure. In some implementations, the series of operations 500 may be performed using one or more semiconductor processing tools located in a semiconductor facility and configured to assemble semiconductor device packages and/or assemblies.

Figure 5A:
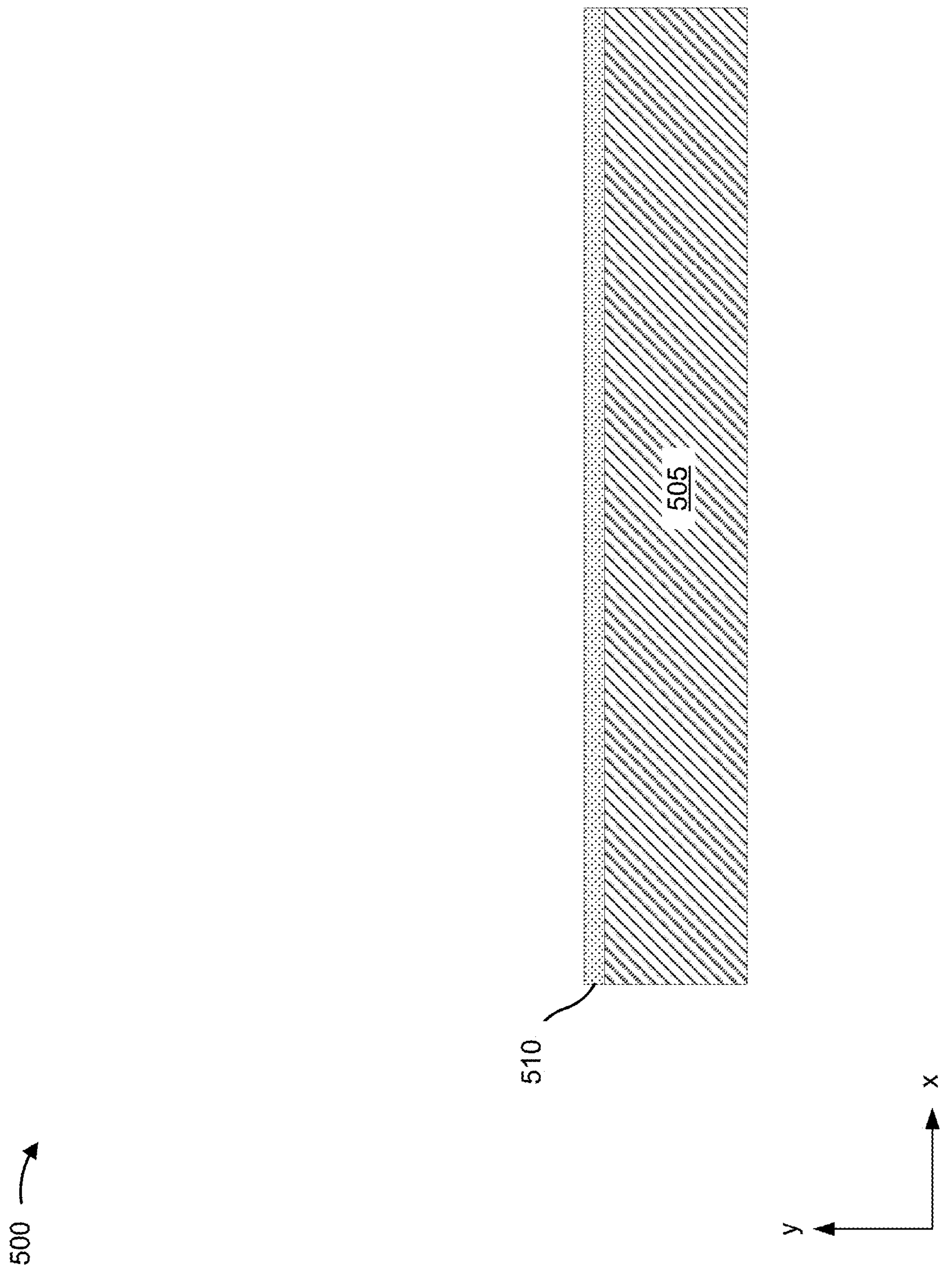
FIGS. 5A-5F describe an example series of operations that may be used to form a terraced support structure.

As shown in FIG. 5A, the series of operations 500 includes forming a carrier 505 with a release layer 510 on and/or over the carrier 505. The carrier 505 may be a strip shape (e.g., a rectangle) or wafer shape (e.g., round). The carrier 505 may include a ceramic material, a silicon material, or another suitable material, among other examples. The release layer 510 may be a sacrificial layer including a polymer material such as a polytetrafluoroethylene (PTFE) material or another suitable material, among other examples.

Figure 5B:
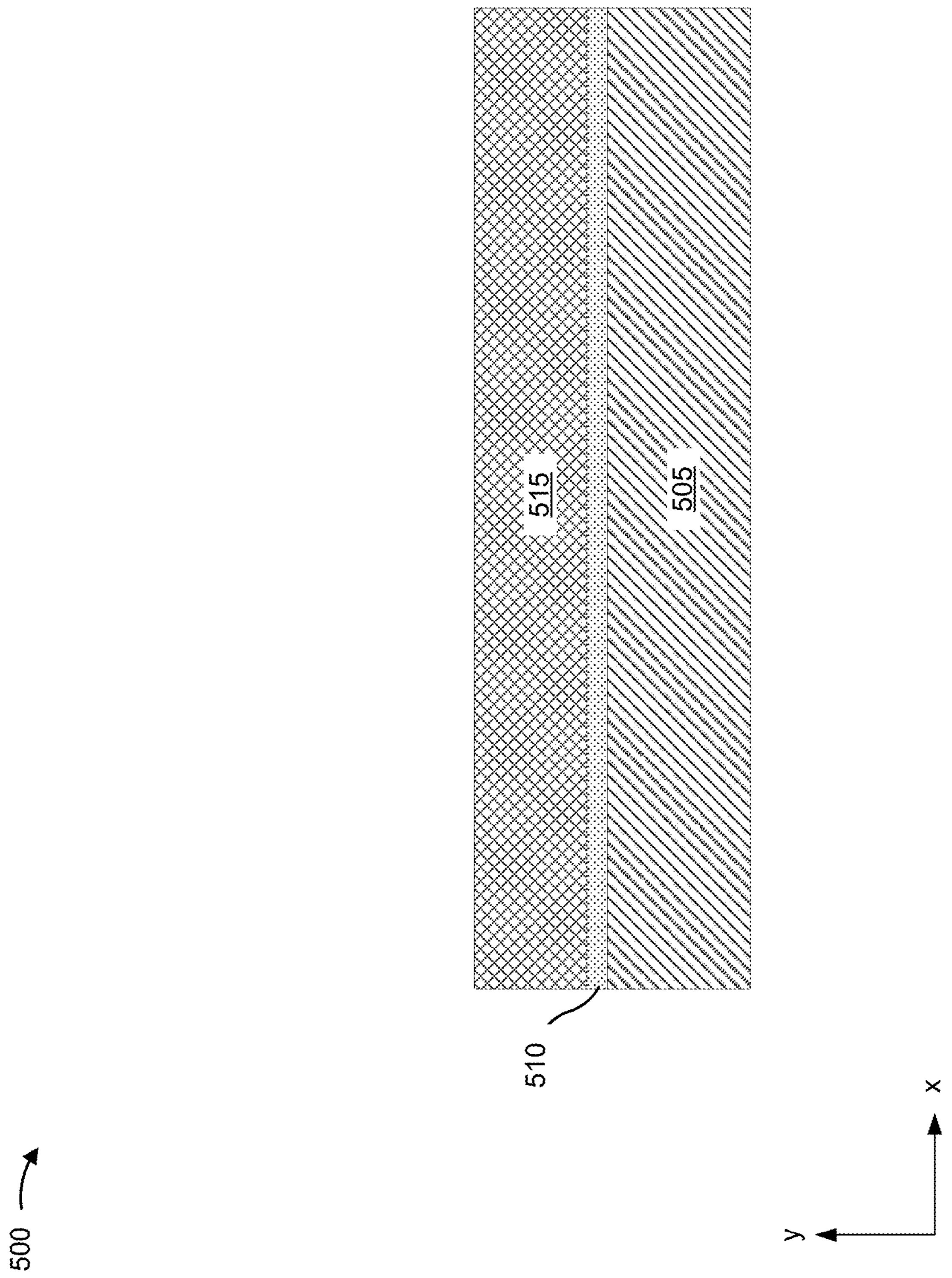

As shown in FIG. 5B, the series of operations 500 includes forming a layer of an epoxy mold compound 515 (e.g., a layer of an epoxy mold compound material) on and/or over the release layer 510. The layer of the epoxy mold compound 515 may include an epoxy resin material, silica filler particulates, and/or a curing agent, among other examples. The layer of the epoxy mold compound 515 may be formed using a compression molding or a transfer molding operation. In some implementations, a thickness of the layer of the epoxy mold compound 515 corresponds to a thickness of a terraced support structure (e.g., the terraced support structure 145). In some implementations, forming the layer of the epoxy mold compound 515 includes a post mold curing (PMC) operation.

Figure 5C:
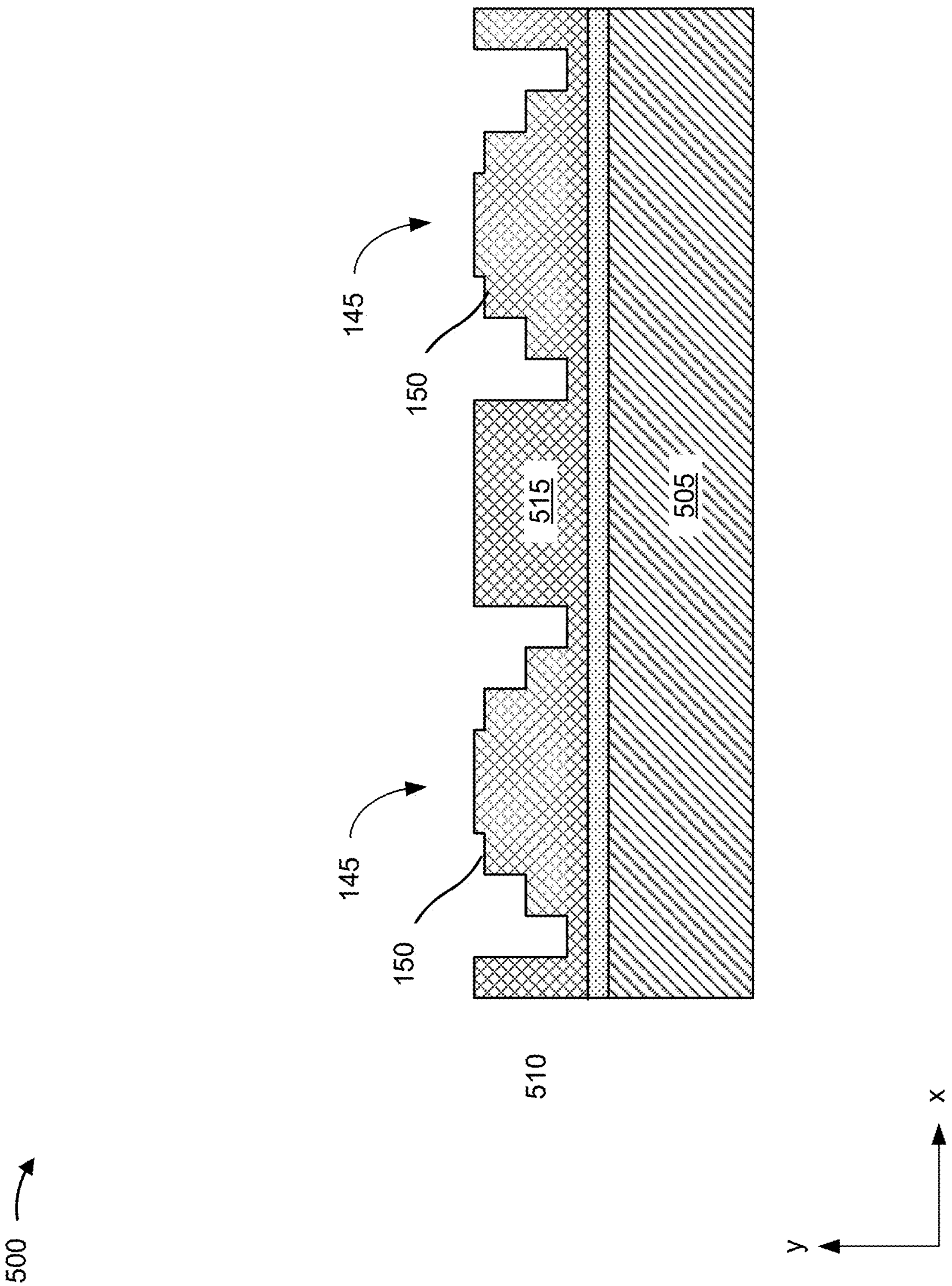

As shown in FIG. 5C, the series of operations 500 includes forming the terraced support structure 145 (or multiples of the terraced support structure 145) in the layer of the epoxy mold compound 515. Forming the terraced support structure 145 may include removing portions of the layer of the epoxy mold compound 515 to form the terraces 150 of the terraced support structure 145. Removing portions of the layer of the epoxy mold compound 515 may include removing the portions using a step cutting operation, a mechanical sawing operation, an etching operation, or a laser ablation operation, among other examples. The portions of the layer of the epoxy mold compound 515 may conform to a profile of overhang portions of a stack of semiconductor dies (e.g., the semiconductor dies 115-1 through 115-5).

Figure 5D:
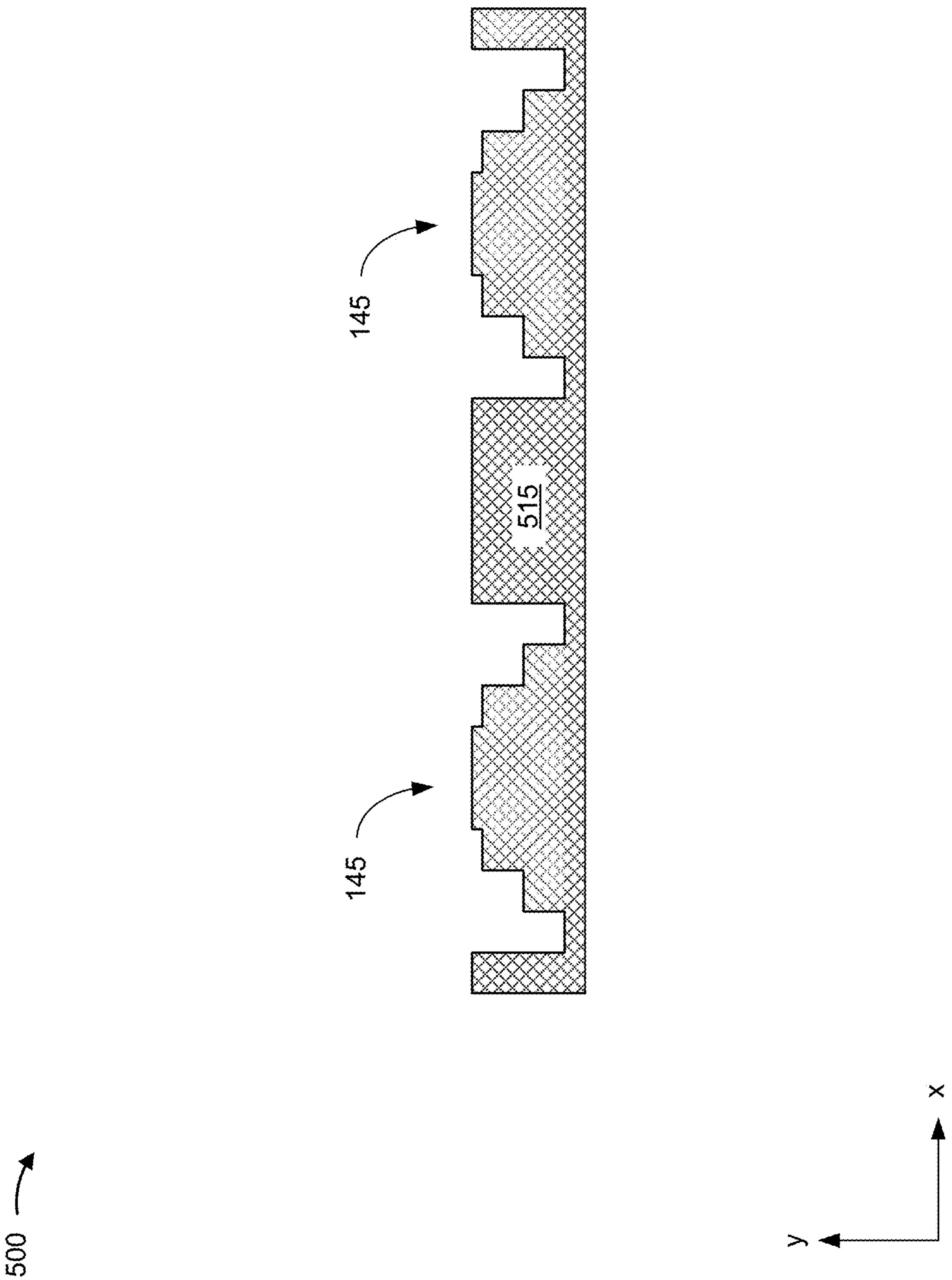

As shown in FIG. 5D, the series of operations 500, includes removing the layer of the epoxy mold compound 515 (including the terraced support structure(s) 145) from the release layer 510 (e.g., debonded from the release layer 510). After removal of the layer of the epoxy mold compound 515, a cleaning operation may remove particulates and or contaminants from the layer of the epoxy mold compound 515.

Figure 5E:
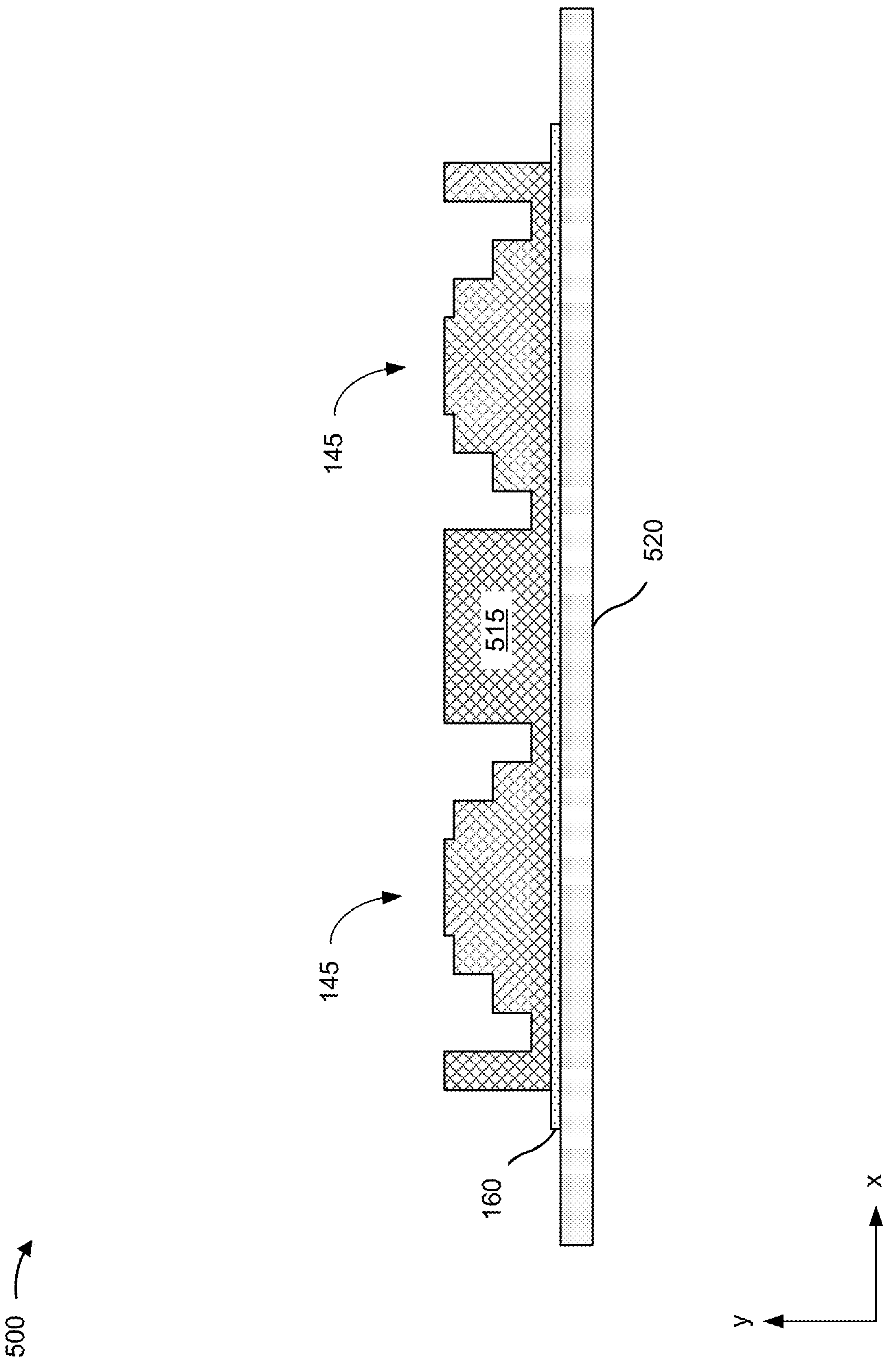

As shown in FIG. 5E, the series of operations 500 includes transferring the layer of the epoxy mold compound 515 (including the terraced support structure(s) 145) to a dicing frame 520. In some implementations, and as shown in FIG. 5E, transferring the layer of the epoxy mold compound 515 includes placing the layer of the epoxy mold compound 515 on the adhesive layer 160 (e.g., a die attach film).

Figure 5F:
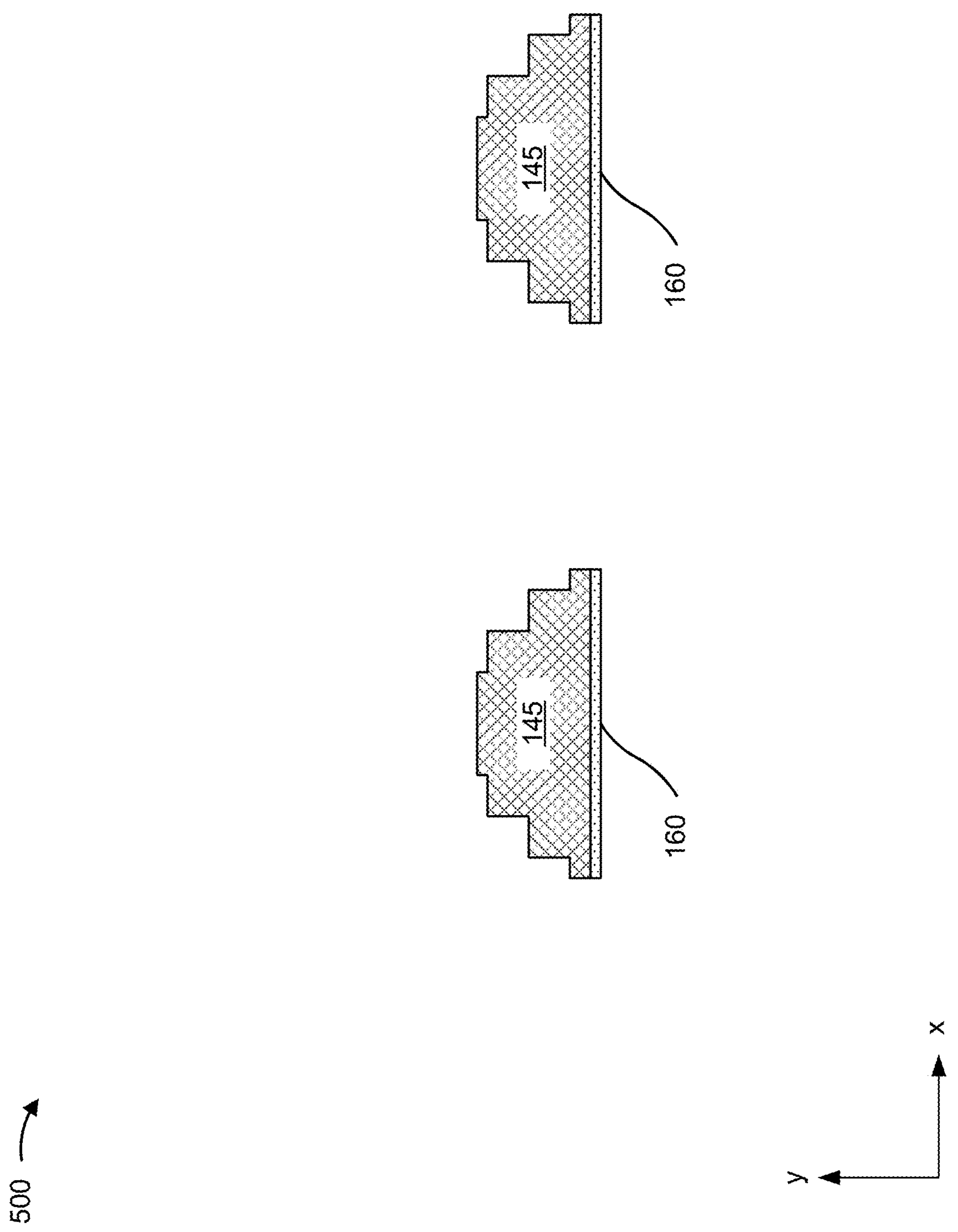

As shown in FIG. 5F, the series of operations 500 includes separating the terraced support structures 145. Separating the terraced support structures 145 may include a dicing operation, a mechanical sawing operation, or another suitable operation, among other examples. In some implementations, portions of the adhesive layer 160 remain on underside surfaces of the terraced support structures 145.

As described in connection with FIGS. 5A-5F and elsewhere herein, a series of operations (e.g., the series of operations 500) includes forming a layer of an epoxy mold compound (e.g., the layer of the epoxy mold compound 515) on a release layer (e.g., the release layer 510). The series of operations includes removing portions of the layer of the epoxy mold compound to form terraced support structures (e.g., the terraced support structure(s) 145) within the layer of epoxy mold compound. The series of operations includes removing the layer of epoxy mold compound including the terraced support structures from the release layer; and separating the terraced support structures.

As indicated above, FIGS. 5A-5F are provided as an example. Other examples may differ from what is described with regard to FIGS. 5A-5F.

Figure 6A:
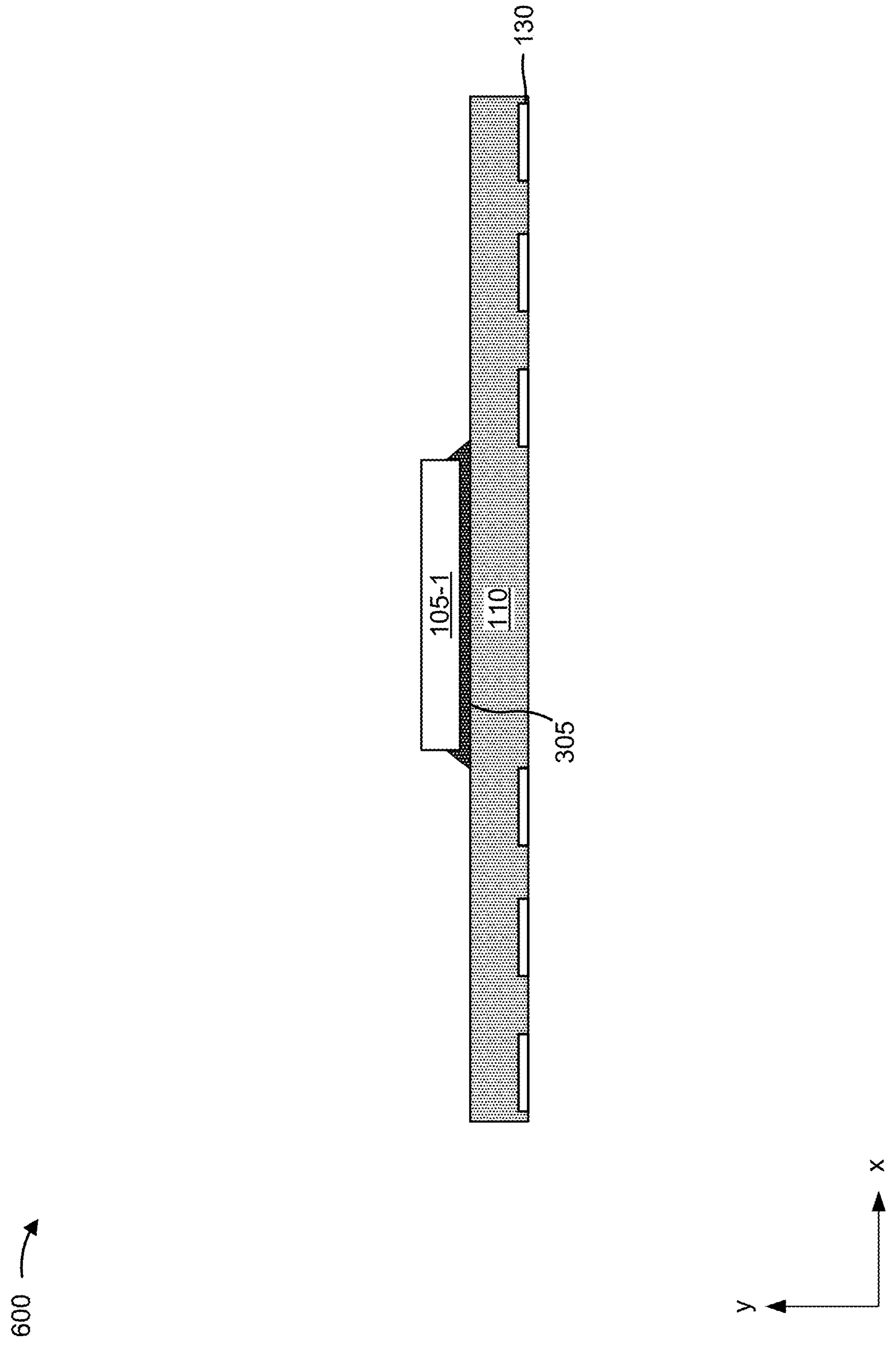
FIGS. 6A-6E describe an example series of operations that may be used to form a semiconductor die package including a terraced support structure.

FIGS. 6A-6E describe an example series of operations 600 that may be used to form a semiconductor die package including a terraced support structure to mitigate stacked die overhang deflection. In some implementations, the series of operations 600 may be performed using one or more semiconductor processing tools located in a semiconductor facility and configured to assemble semiconductor device packages and/or assemblies. As shown in FIG. 6A, the series of operations includes placing the integrated circuit 105-1 (e.g., a semiconductor die such as a microcontroller) on the substrate 110. Placing the integrated circuit 105-1 on the substrate 110 may include dispensing the underfill material 305 between the integrated circuit 105-1 and the substrate 110.

Figure 6B:
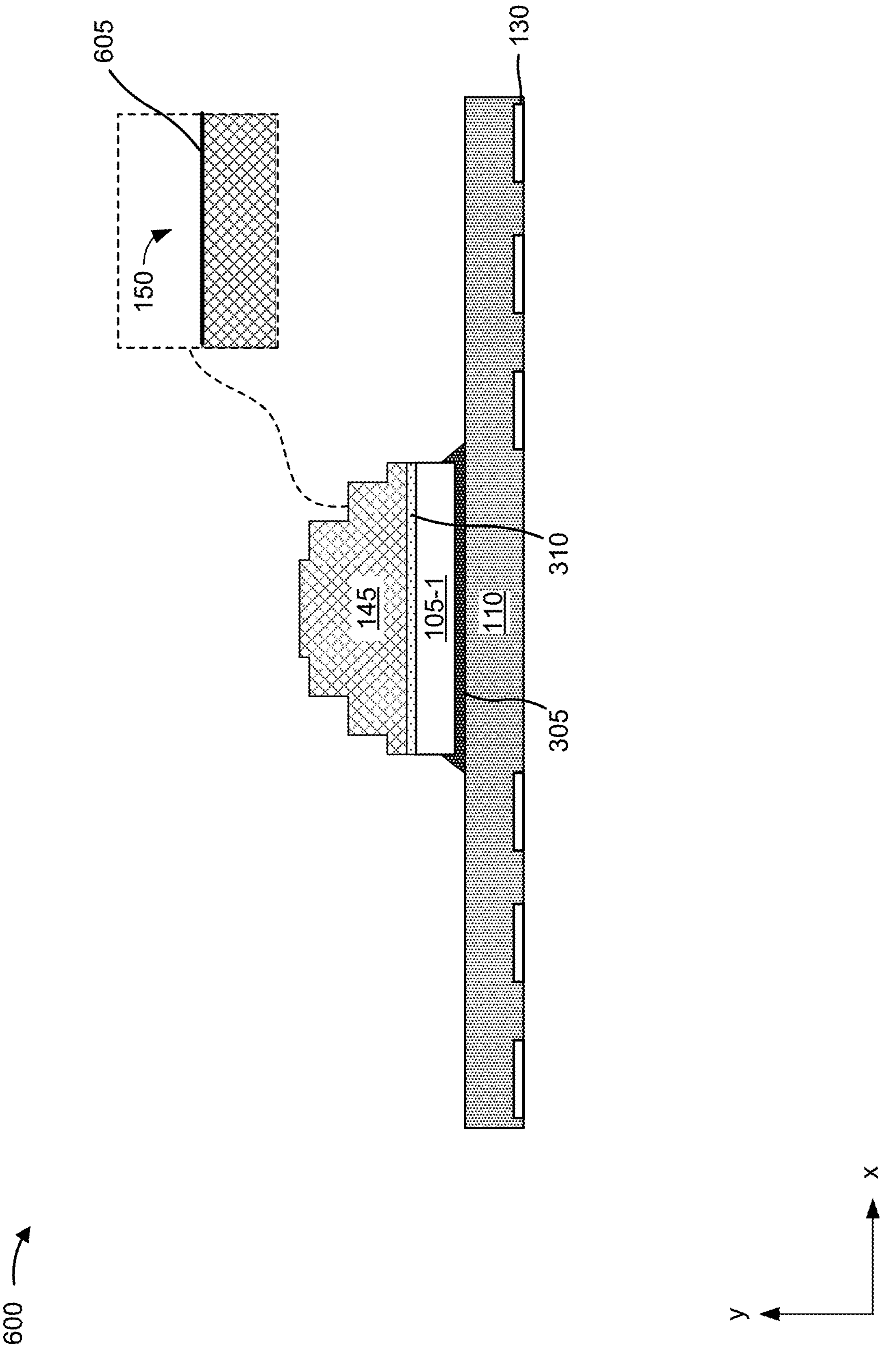

As shown in FIG. 6B, the series of operations 600 includes placing the terraced support structure 145 over and/or on the integrated circuit 105-1. Placing the terraced support structure 145 over and/or on the integrated circuit 105-1 may include joining opposing surfaces of the terraced support structure 145 and the integrated circuit 105-1 with an adhesive layer (e.g., the adhesive layer 310).

In some implementations, placing the terraced support structure 145 over and/or on the integrated circuit 105-1 includes dispensing a layer of a compliant material 605 on one or more terrace(s) 150 of the terraced support structure 145. The compliant material 605 (e.g., an underfill material or an epoxy polymer material) may provide additional robustness and/or reduce gaps between the one or more terraces 150 and overhang regions (e.g., the overhang region(s) 155) associated with one or more semiconductor dies (e.g., one or more of the semiconductor dies 115).

Figure 6C:
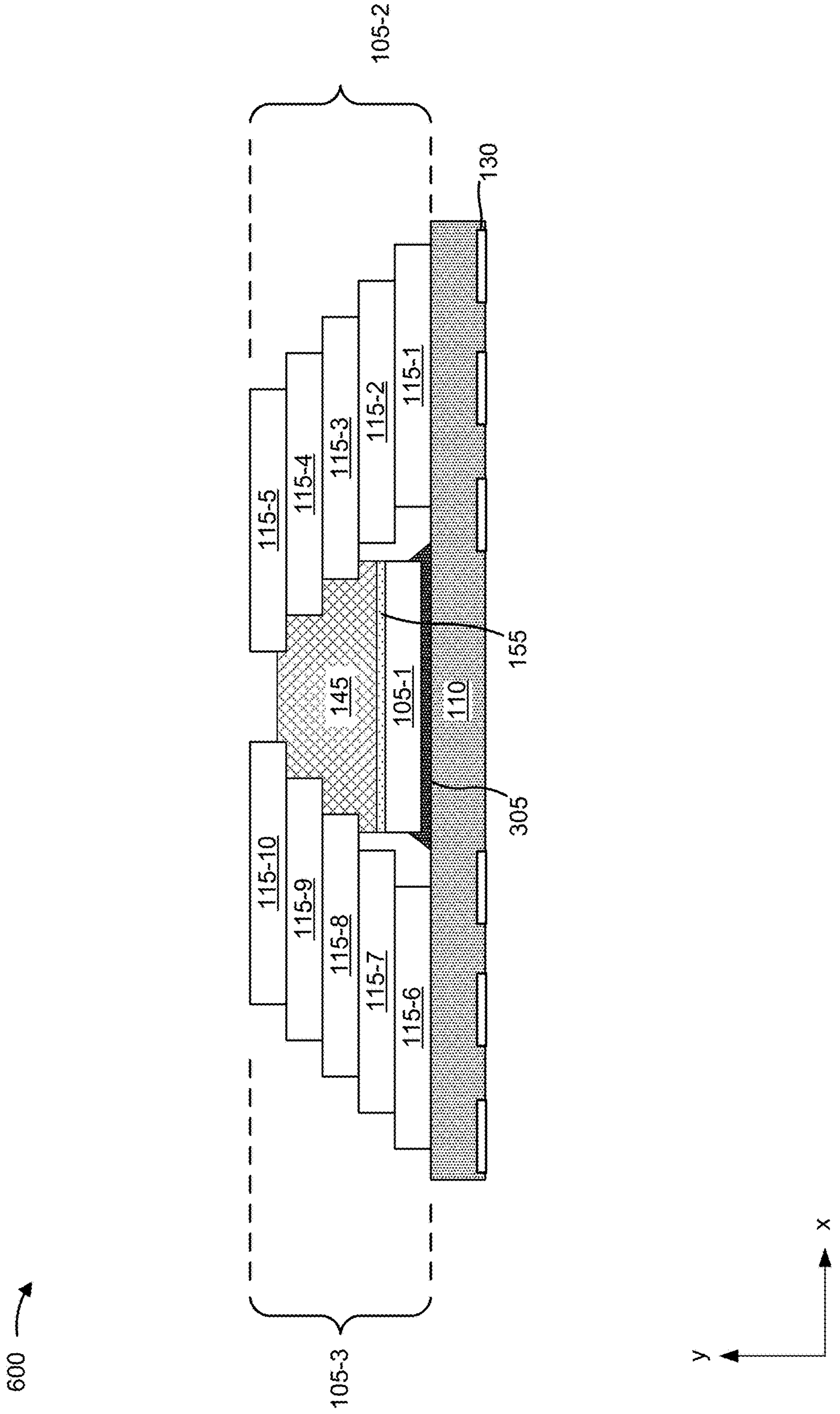

As shown in FIG. 6C, the series of operation includes forming the integrated circuits 105-2 and 105-3 (e.g., the stacked die arrangement including the semiconductor dies 115-1 through 115-5 and the stacked die arrangement including the semiconductor dies 115-6 through 115-10) over the substrate 110. For example, and in some implementations, a die attach tool forms the integrated circuits 105-2 and 105-3 over the substrate 110.

Figure 6D:
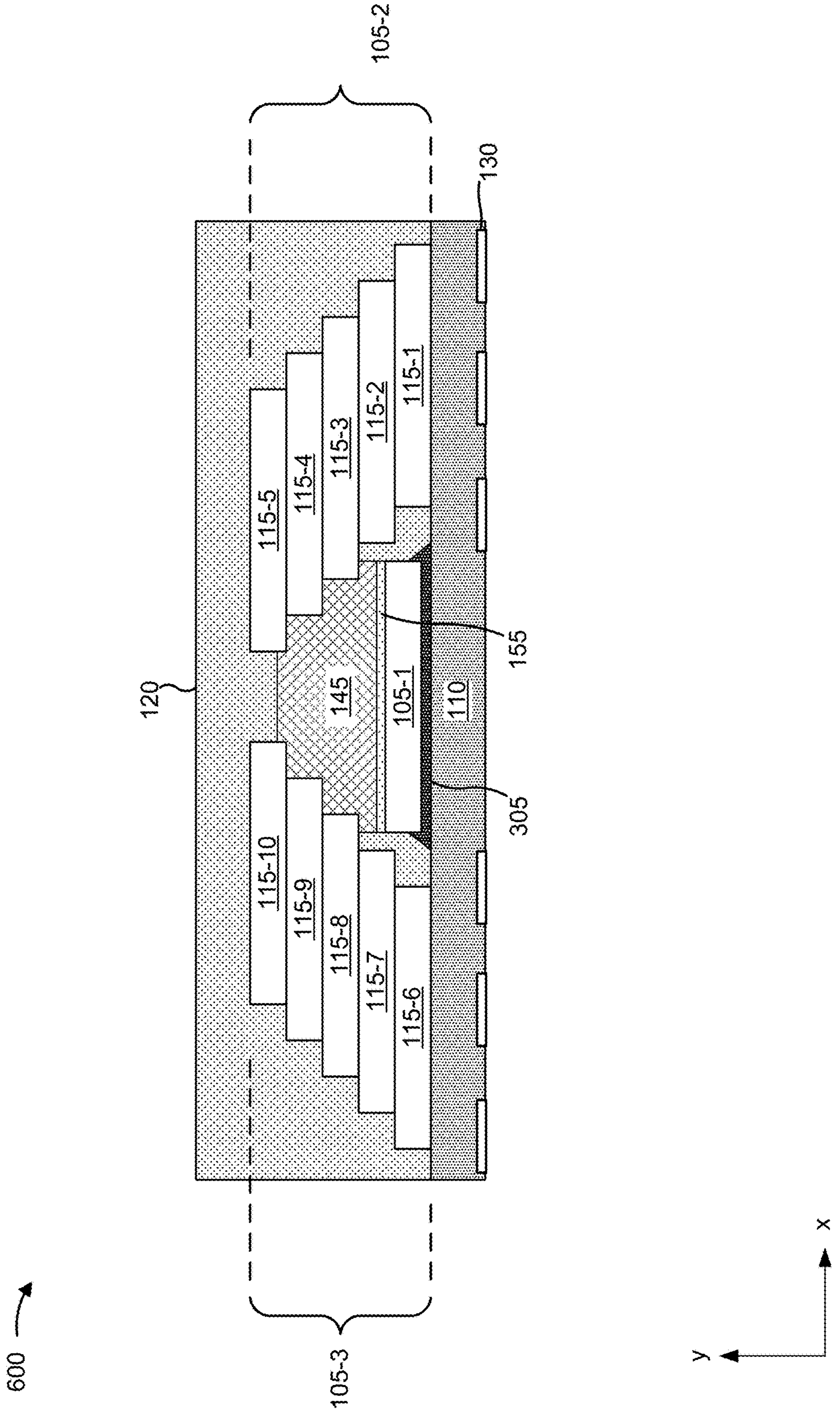

As shown in FIG. 6D, the integrated circuit 105-1, the integrated circuit 105-2, the integrated circuit 105-3, and the terraced support structure 145 are encapsulated with a casing 120. For example, and in some implementations, a molding tool may encapsulate the integrated circuit 105-1, the integrated circuit 105-2, the integrated circuit 105-3, and the terraced support structure 145 with an epoxy mold compound. During the encapsulation, and as shown in FIG. 6D, the terraced support structure 145 may mitigate a deflection of the semiconductor dies 115-3 through 115-5 and/or a deflection of the semiconductor dies 115-8 through 115-10).

Figure 6E:
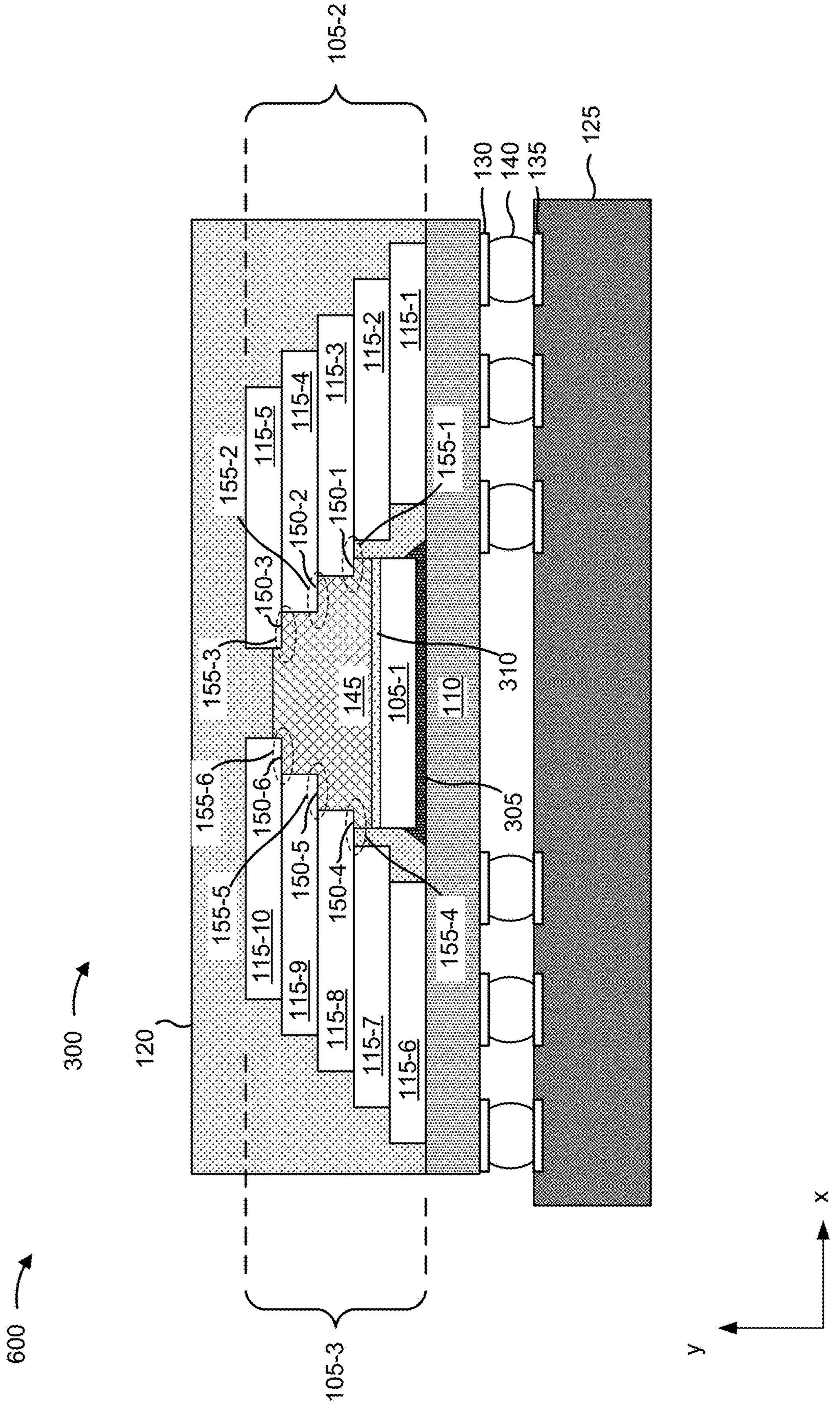

As shown in FIG. 6E, the circuit board 125 and the substrate 110 are connected to form the apparatus 300. As an example, and in some implementations, a pick and place tool may co-locate the circuit board 125 (including the solder balls 140) and the substrate. A reflow tool may then reflow the solder balls 140 connect the circuit board 125 and the substrate 110 to form the apparatus 100.

In some implementations, a sequence of operations related to placing one or more of the semiconductor dies 115-1 through 115-10 and placing the terraced support structure 145 may vary. For example, and in the context of FIGS. 6A-6E, a sequence may include placing the terraced support structure 145 prior to placing the semiconductor dies 115-1, 115-2, 115-6, and 115-7. As another example, and in the context of FIGS. 6A-6E, another sequence may include placing the terraced support structure 145 after placing the semiconductor dies 115-1, 115-2, 115-6, and 115-7.

As described in connection with FIGS. 6A-6E and elsewhere herein, a series of operations (e.g., the series of operations 600) includes placing a first semiconductor die (e.g., the semiconductor die 115-3) above a substrate (e.g., the substrate 110) and placing a second semiconductor die (e.g., the semiconductor die 115-4) above the first semiconductor die to achieve a stacked arrangement of the second semiconductor die above the first semiconductor die in which a terrace (e.g., the terrace 150-2) of a terraced support structure (e.g., the terraced support structure 145) is directly below an overhang portion (e.g., the overhang portion 155-2) of the second semiconductor die.

As indicated above, FIGS. 6A-6E are provided as an example. Other examples may differ from what is described with regard to FIGS. 6A-6E.

Implementations described in connection with FIGS. 1-6E are directed to a semiconductor die package (e.g., the apparatus 100) including a stacked die arrangement (e.g., the stacked arrangement including the semiconductor dies 115). The semiconductor die package includes a terraced support structure (e.g., the terraced support structure 145) between overhang portions (e.g., the overhang portions 155) of the stacked die arrangement and a substrate (e.g., the substrate 110) of the semiconductor die package. The terraced support structure may reduce a likelihood of the overhang portions deflecting during manufacturing of the semiconductor die package. By reducing the likelihood of the overhang portions deflecting, a quality and reliability of the semiconductor die package may be increased relative to a quality and reliability of another semiconductor die package (e.g., including another stacked die arrangement) that does not include the terraced support structure.

In this way, an amount of resources (e.g., semiconductor manufacturing tools, manpower, computing resources, and/or raw materials) needed to support a market of the semiconductor die package may be decreased. Such resources may, accordingly, be reallocated to other semiconductor die package manufacturing needs.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

Figure 7:
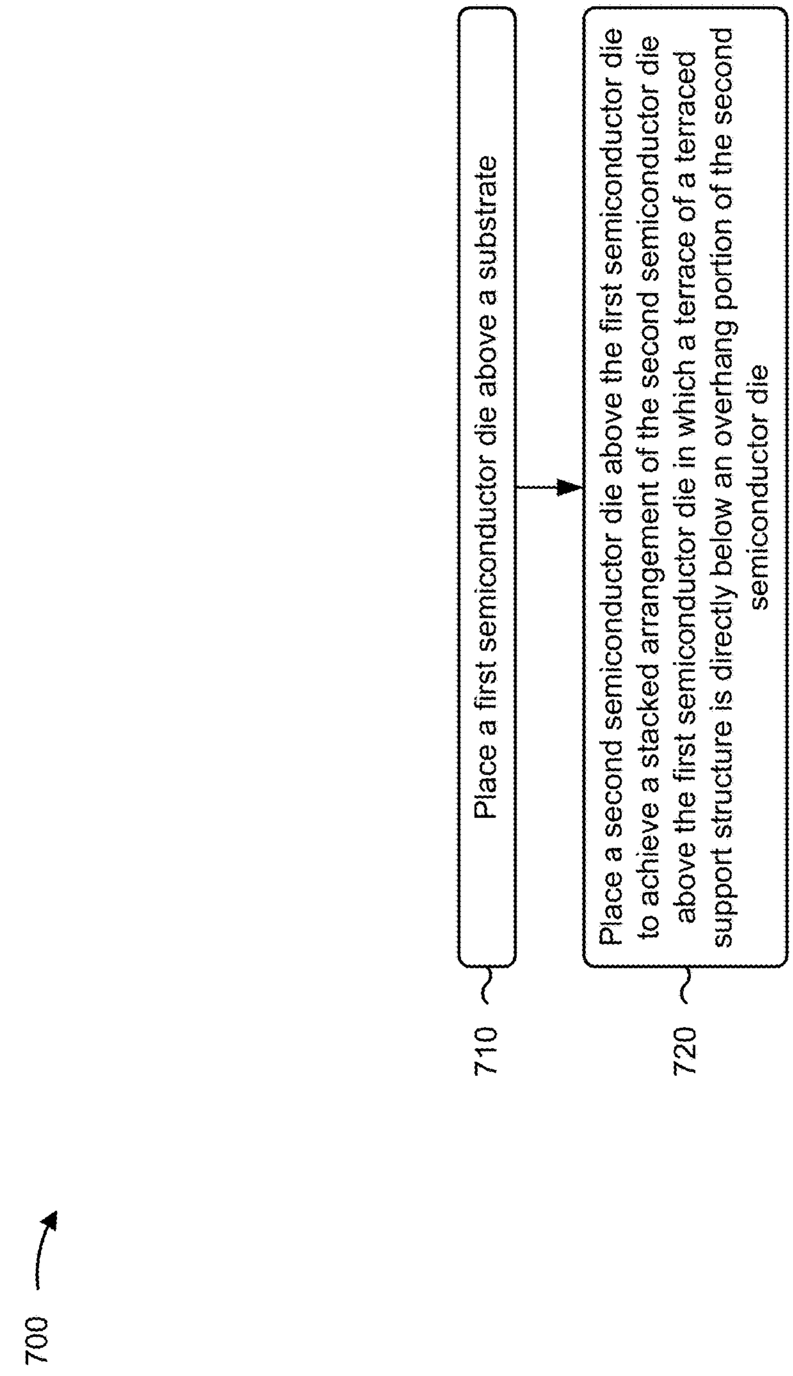
FIG. 7 is a flowchart of an example method of forming an integrated assembly or memory device having a terraced support structure.

FIG. 7 is a flowchart of an example method 700 of forming an integrated assembly or memory device having a terraced support structure to mitigate stacked die overhang deflection. In some implementations, one or more process blocks of FIG. 7 may be performed by various semiconductor manufacturing equipment. In some implementations, the method 700 includes forming a semiconductor device assembly (e.g., the apparatus 100 of FIG. 1 and/or the apparatus 300 of FIG. 3) that includes the terraced support structure 145.

As shown in FIG. 7, the method 700 may include placing a first semiconductor die above a substrate (block 710). As further shown in FIG. 7, the method 700 may include placing a second semiconductor die above the first semiconductor die to achieve a stacked arrangement of the second semiconductor die above the first semiconductor die in which a terrace of a terraced support structure is directly below an overhang portion of the second semiconductor die (block 720).

The method 700 may include additional aspects, such as any single aspect or any combination of aspects described below and/or described in connection with one or more other methods or operations described elsewhere herein.

In a first aspect, the method 700 includes dispensing a compliant material onto the terrace of the terraced support structure prior to placing the second semiconductor die above the first semiconductor die.

In a second aspect, alone or in combination with the first aspect, the second semiconductor die comprises an adhesive layer on an underside surface of the second semiconductor die, and placing the second semiconductor die above the first semiconductor die comprises compressing the adhesive layer between the underside surface of the second semiconductor die and the terrace.

In a third aspect, alone or in combination with one or more of the first and second aspects, the terrace is a first terrace and the method 700 includes placing a third semiconductor die above the substrate, and placing a fourth semiconductor die above the third semiconductor die to achieve a stacked arrangement of the fourth semiconductor die above the third semiconductor die in which a second terrace of a terraced support structure is directly below an overhang portion of the fourth semiconductor die.

In a fourth aspect, alone or in combination with one or more of the first through third aspects, the method 700 includes forming the terraced support structure, and placing the terraced support structure on a third semiconductor die.

In a fifth aspect, alone or in combination with one or more of the first through fourth aspects, forming the terraced support structure comprises forming the terraced support structure using a forging operation, a stamping operation, an injection molding operation, a casting operation, a milling operation, or a three-dimensional printing operation.

In a sixth aspect, alone or in combination with one or more of the first through fifth aspects, the terraced support structure comprises an adhesive layer on an underside surface of the terraced support structure, and placing the terraced support structure on the third semiconductor die comprises placing the terraced support structure such that the adhesive layer joins with a topside surface of the third semiconductor die.

In a seventh aspect, alone or in combination with one or more of the first through sixth aspects, placing the terraced support structure on the third semiconductor die comprises placing the terraced support structure on the third semiconductor die prior to placing the first semiconductor die.

In an eighth aspect, alone or in combination with one or more of the first through seventh aspects, placing the terraced support structure on the third semiconductor die comprises placing the terraced support structure on the third semiconductor die after placing the first semiconductor die.

Although FIG. 7 shows example blocks of the method 700, in some implementations, the method 700 may include additional blocks, fewer blocks, different blocks, or differently arranged blocks than those depicted in FIG. 7. Additionally, or alternatively, two or more of the blocks of the method 700 may be performed in parallel. In some implementations, the method 700 may include forming the terraced support structure 145, an integrated assembly that includes the terraced support structure 145, any part described herein of the terraced support structure 145, and/or any part described herein of an integrated assembly that includes the structure terraced support structure 145.

Figure 8:
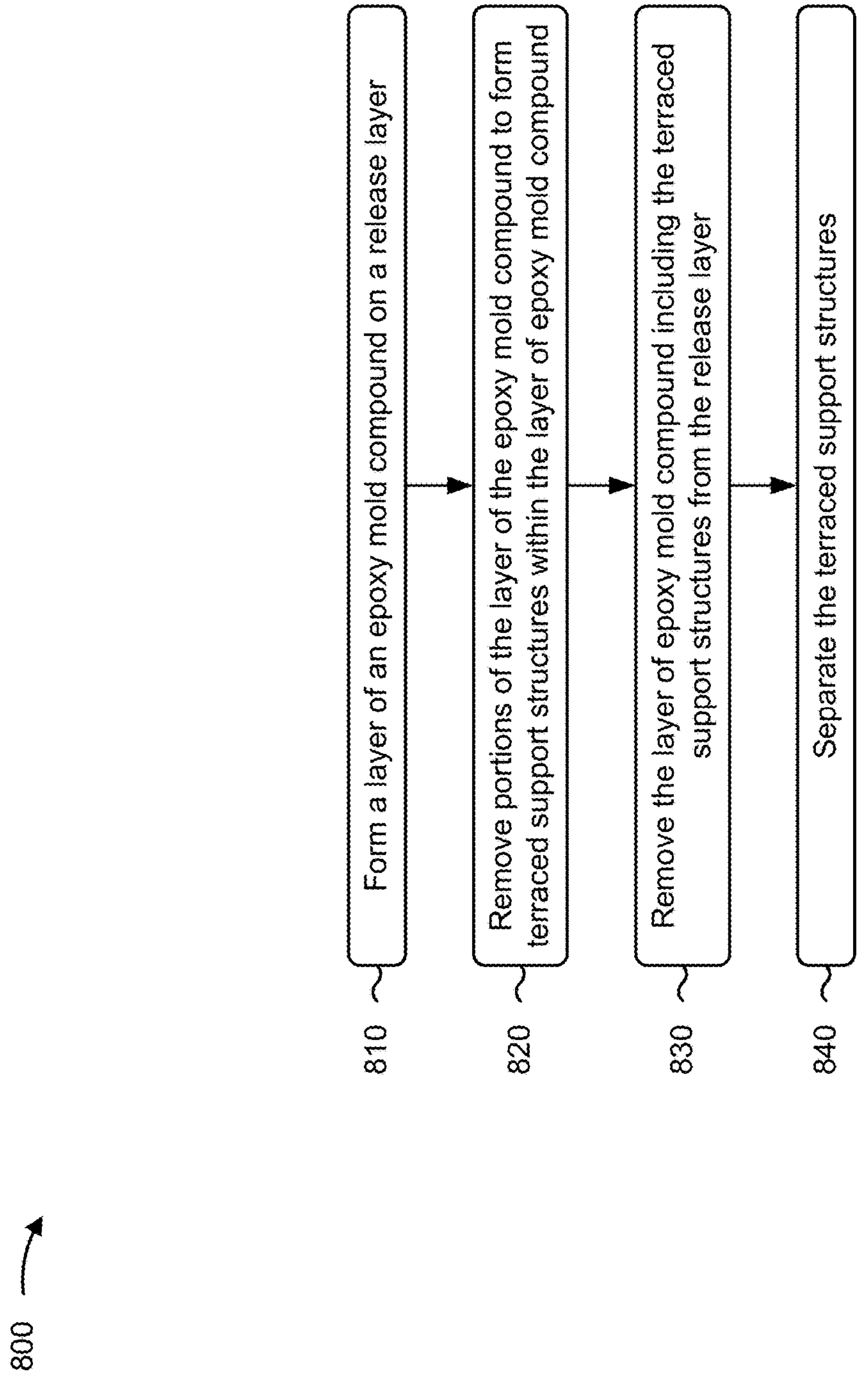
FIG. 8 is a flowchart of an example method of forming a terraced support structure.

FIG. 8 is a flowchart of an example method 800 of forming a terraced support structure to mitigate stacked die overhang deflection. In some implementations, one or more process blocks of FIG. 8 may be performed by various semiconductor manufacturing equipment.

As shown in FIG. 8, the method 800 may include forming a layer of an epoxy mold compound on a release layer (block 810). As further shown in FIG. 8, the method 800 may include removing portions of the layer of the epoxy mold compound to form terraced support structures within the layer of epoxy mold compound (block 820). As further shown in FIG. 8, the method 800 may include removing the layer of epoxy mold compound including the terraced support structures from the release layer (block 830). As further shown in FIG. 8, the method 800 may include separating the terraced support structures (block 840).

The method 800 may include additional aspects, such as any single aspect or any combination of aspects described below and/or in connection with one or more other methods described elsewhere herein.

In a first aspect, removing portions of the layer of the epoxy mold compound comprises removing the portions of the layer of the epoxy mold compound using a mechanical sawing operation, removing the portions of the layer of the epoxy mold compound using an etching operation, or removing the portions of the layer of the epoxy mold compound using a laser ablation operation.

In a second aspect, alone or in combination with the first aspect, the method 800 includes transferring the layer of the epoxy mold compound including the terraced support structures to a dicing frame prior to separating the terraced support structures, wherein transferring the layer of the epoxy mold compound including the terraced support structures includes placing the layer of the epoxy mold compound including the terraced support structures on a die attach film held by the dicing frame.

In a third aspect, alone or in combination with one or more of the first and second aspects, separating the terraced support structures comprises dicing the terraced support structures from the layer of the epoxy mold compound.

In a fourth aspect, alone or in combination with one or more of the first through third aspects, portions of the die attach film remain on underside surfaces of the terraced support structures after dicing.

Although FIG. 8 shows example blocks of the method 800, in some implementations, the method 800 may include additional blocks, fewer blocks, different blocks, or differently arranged blocks than those depicted in FIG. 8. Additionally, or alternatively, two or more of the blocks of the method 800 may be performed in parallel. In some implementations, the method 800 may include forming the terraced support structure 145, an integrated assembly that includes the terraced support structure 145, any part described herein of the terraced support structure 145, and/or any part described herein of an integrated assembly that includes the terraced support structure 145.

Figure 9:
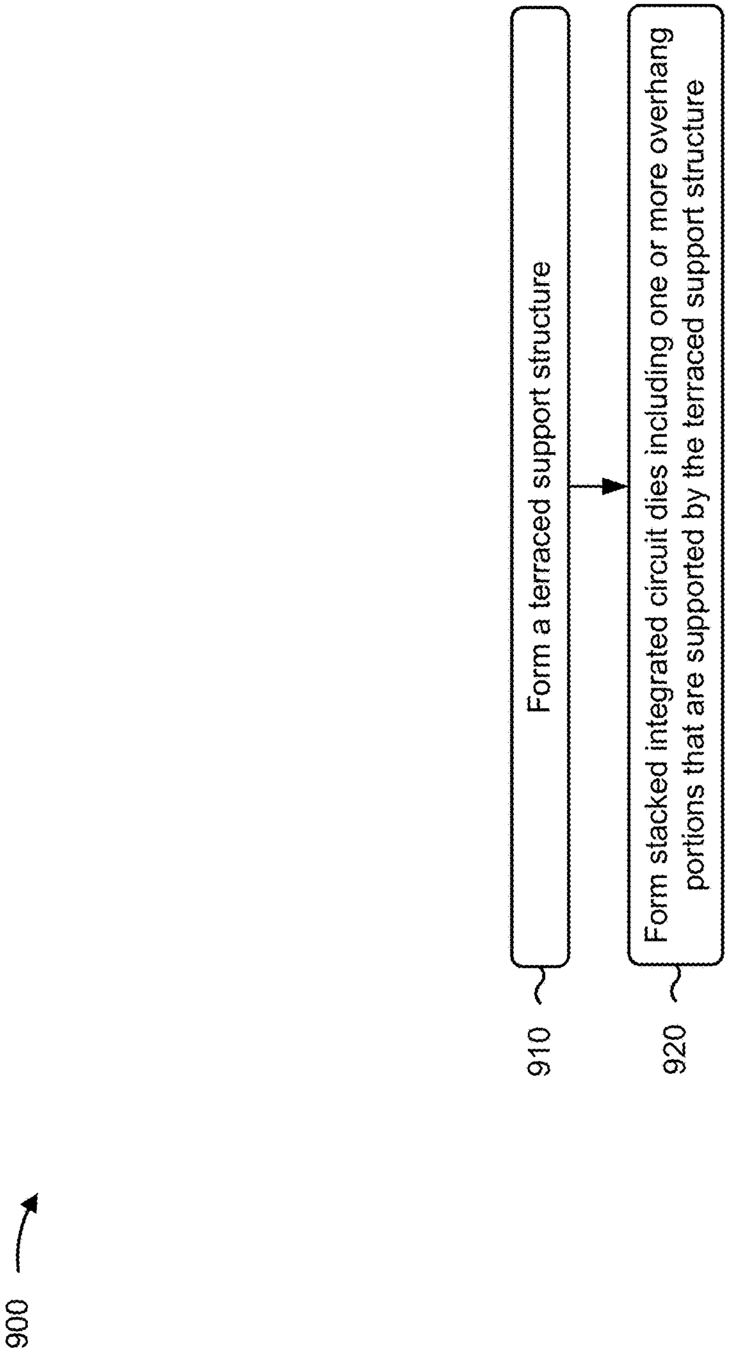
FIG. 9 is a flowchart of an example method associated with a terraced support structure.

FIG. 9 is a flowchart of an example method 900 associated with a terraced support structure to mitigate stacked die overhang deflection. In some implementations, one or more process blocks of FIG. 9 may be performed by various semiconductor manufacturing equipment. In some implementations, the method 900 may include forming an integrated assembly (e.g., the memory device of FIG. 2) that includes the stacked integrated circuit dies 225 and the terraced support structure 145.

As shown in FIG. 9, the method 900 includes forming a terraced support structure (block 910). As further shown in FIG. 9, the method 900 includes forming stacked integrated circuit dies including one or more overhang portions that are supported by the terraced support structure (block 920).

Although FIG. 9 shows example blocks of a method 900, in some implementations, the method 900 may include additional blocks, fewer blocks, different blocks, or differently arranged blocks than those depicted in FIG. 9. Additionally, or alternatively, two or more of the blocks of the method 900 may be performed in parallel. In some implementations, the method 900 may include forming the terraced support structure 145, an integrated assembly that includes the terraced support structure 145, any part described herein of the terraced support structure 145, and/or any part described herein of an integrated assembly that includes the terraced support structure 145.

In some implementations, a semiconductor device assembly includes a substrate; a first semiconductor die above the substrate and comprising: an edge; a second semiconductor die in a stacked arrangement above the first semiconductor die and comprising: an overhang portion extending beyond the edge; and a terraced support structure between the overhang portion and the substrate and comprising: a terrace traversing a path that is approximately parallel to the edge and directly below the overhang portion.

In some implementations, a semiconductor device assembly includes a substrate; a first semiconductor die, in a first stack of semiconductor dies, above the substrate and comprising: a first edge; a second semiconductor die, in a second stack of semiconductor dies, above the substrate, proximate to the first semiconductor die, and comprising: a second edge that is approximately parallel the first edge and separated from the first edge; a third semiconductor die in a stacked arrangement above the first semiconductor die in the first stack of semiconductor dies and comprising: a first overhang portion extending beyond the first edge; a fourth semiconductor die in a stacked arrangement above the second semiconductor die in the second stack of semiconductor dies and comprising: a second overhang portion extending beyond the second edge; and a terraced support structure between the first semiconductor die and the second semiconductor die and comprising: a first terrace directly under the first overhang portion and configured to support the first overhang portion; and a second terrace directly under the second overhang portion and configured to support the second overhang portion.

In some implementations, a semiconductor device assembly includes a substrate; a first stack of semiconductor dies above the substrate and comprising: first overhang portions having a first staggered profile; a second stack of semiconductor dies above the substrate and comprising: second overhang portions having a second staggered profile wherein the second overhang portions extend laterally towards the first stack of semiconductor dies; a terraced support structure between the first stack of semiconductor dies and the second stack of semiconductor dies and comprising: a first set of terraces that conforms to the first staggered profile; and a second set of terraces that conforms to the second staggered profile.

In some implementations, a method includes placing a first semiconductor die above a substrate; and placing a second semiconductor die above the first semiconductor die to achieve a stacked arrangement of the second semiconductor die above the first semiconductor die in which a terrace of a terraced support structure is directly below an overhang portion of the second semiconductor die.

In some implementations, a method includes forming a layer of an epoxy mold compound on a release layer; removing portions of the layer of the epoxy mold compound to form terraced support structures within the layer of epoxy mold compound; removing the layer of epoxy mold compound including the terraced support structures from the release layer; and separating the terraced support structures.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

As used herein, the terms "substantially" and "approximately" mean "within reasonable tolerances of manufacturing and measurement." All ranges described herein are inclusive of numbers at the ends of those ranges, unless specifically indicated otherwise. As used herein, "satisfying a threshold" may, depending on the context, refer to a value being greater than the threshold, greater than or equal to the threshold, less than the threshold, less than or equal to the threshold, equal to the threshold, not equal to the threshold, or the like. All ranges described herein are inclusive of numbers at the ends of those ranges, unless specifically indicated otherwise.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor device assembly, comprising:

a substrate;

a first semiconductor die above the substrate and comprising:

an edge;

a second semiconductor die in a stacked arrangement above the first semiconductor die and comprising:

an overhang portion extending beyond the edge; and a terraced support structure between the overhang portion and the substrate and comprising:

a terrace traversing a path that is approximately parallel to the edge and directly below the overhang portion.

2. The semiconductor device assembly of claim 1, wherein the terraced support structure comprises:

a solid body, wherein the solid body comprises:

an epoxy mold compound material.

3. The semiconductor device assembly of claim 1, wherein the terraced support structure comprises:

a solid body, wherein the solid body comprises:

a silicon material, a ceramic material, a glass material, or a polymer material.

4. The semiconductor device assembly of claim 1, wherein the substrate comprises:

a thermal via, and wherein the thermal via and the terraced support structure are thermally coupled.

5. The semiconductor device assembly of claim 4, wherein the thermal via is a first thermal via and the terraced support structure comprises:

a second thermal via that aligns with the first thermal via.

6. The semiconductor device assembly of claim 1, further comprising:

an adhesive layer on an underside surface of the second semiconductor die, wherein the adhesive layer is between the underside surface of the second semiconductor die and the terrace.

7. The semiconductor device assembly of claim 6, wherein the terrace and the adhesive layer are in contact with each other.

8. The semiconductor device assembly of claim 1, wherein the first semiconductor die comprises:

a first memory device, and wherein the second semiconductor die comprises:

a second memory device.

9. The semiconductor device assembly of claim 8, wherein at least one of the first memory device or the second memory device comprises:

a NAND memory device.

10. The semiconductor device assembly of claim 8, wherein at least one of the first memory device or the second memory device comprises:

a dynamic random access memory device.

11. A semiconductor device assembly, comprising:

a substrate;

a first semiconductor die, in a first stack of semiconductor dies, above the substrate and comprising:

a first edge;

a second semiconductor die, in a second stack of semiconductor dies, above the substrate, proximate to the first semiconductor die, and comprising:

a second edge that is approximately parallel to the first edge and separated from the first edge;

a third semiconductor die in a stacked arrangement above the first semiconductor die in the first stack of semiconductor dies and comprising:

a first overhang portion extending beyond the first edge;

a fourth semiconductor die in a stacked arrangement above the second semiconductor die in the second stack of semiconductor dies and comprising:

a second overhang portion extending beyond the second edge; and a terraced support structure between the first semiconductor die and the second semiconductor die and comprising:

a first terrace directly under the first overhang portion and configured to support the first overhang portion; and a second terrace directly under the second overhang portion and configured to support the second overhang portion.

12. The semiconductor device assembly of claim 11, further comprising:

a compliant material, wherein the compliant material is between the first terrace and the first overhang portion, and wherein the compliant material is between the second terrace and the second overhang portion.

13. The semiconductor device assembly of claim 12, wherein the compliant material comprises:

an underfill material.

14. The semiconductor device assembly of claim 11, further comprising:

a fifth semiconductor die, wherein the fifth semiconductor die is under the terraced support structure.

15. The semiconductor device assembly of claim 14, further comprising:

an adhesive layer that joins the fifth semiconductor die and the terraced support structure.

16. A semiconductor device assembly, comprising:

a substrate;

a first stack of semiconductor dies above a substrate and comprising:

first overhang portions having a first staggered profile;

a second stack of semiconductor dies above the substrate and comprising:

second overhang portions having a second staggered profile;

wherein the second overhang portions extend laterally towards the first stack of semiconductor dies; and a terraced support structure between the first stack of semiconductor dies and the second stack of semiconductor dies and comprising:

a first set of terraces that conforms to the first staggered profile; and a second set of terraces that conforms to the second staggered profile.

17. The semiconductor device assembly of claim 16, wherein the first staggered profile comprises:

a staggered profile that is symmetric with the second staggered profile.

18. The semiconductor device assembly of claim 16, wherein the first staggered profile comprises:

a staggered profile that is asymmetric with the second staggered profile.

19. The semiconductor device assembly of claim 16, wherein the first stack of semiconductor dies further comprises:

third overhang portions below the first overhang portions, wherein the third overhang portions are unsupported by the terraced support structure.

20. The semiconductor device assembly of claim 16, wherein the terraced support structure is directly on the substrate.

* * * * *